US006175849B1

(12) United States Patent
Smith

(10) Patent No.: US 6,175,849 B1
(45) Date of Patent: Jan. 16, 2001

(54) SYSTEM FOR DIGITAL FILTERING IN A FIXED NUMBER OF CLOCK CYCLES

(75) Inventor: Lane Allen Smith, Easton, PA (US)

(73) Assignee: Lucent Technologies, Inc., Murray Hill, NJ (US)

( * ) Notice: Under 35 U.S.C. 154(b), the term of this patent shall be extended for 0 days.

(21) Appl. No.: 09/021,582

(22) Filed: Feb. 10, 1998

(51) Int. Cl.[7] .................................................. G06F 17/17
(52) U.S. Cl. .......................... 708/320; 708/313; 708/523
(58) Field of Search .................................... 708/320, 313, 708/523

(56) References Cited

U.S. PATENT DOCUMENTS

| | | | | |
|---|---|---|---|---|
| 4,255,794 | * | 3/1981 | Nakayama | 708/320 |
| 5,375,077 | * | 12/1994 | Yanaga et al. | 708/320 |
| 5,438,532 | * | 8/1995 | Nagao | 708/320 |
| 5,487,023 | * | 1/1996 | Seckora | 708/320 |
| 5,553,103 | * | 9/1996 | Julyan et al. | 708/320 |
| 5,732,002 | * | 3/1998 | Lee et al. | 708/320 |

OTHER PUBLICATIONS

Analog Devices et al., "Audio Codec '97; Cpmponent Specification; Revision 1.03; Sep. 15, 1996" Sep. 15, 1997.
Intel Corporation, "Audio Codec '97; Revision 2.0, Sep. 29, 1997", Sep. 29, 1997.

* cited by examiner

Primary Examiner—David H. Malzahn
(74) Attorney, Agent, or Firm—William H. Bollman

(57) ABSTRACT

An integrated circuit, e.g. an AC '97 conforming audio codec, includes a digital filter and gain module including multiple channels of gain control and multiple channels of digital filtering. A gain control module includes an overflow check of data samples requiring differing lengths of clamping. Each channel of the digital filter includes a finite impulse response (FIR) filter, and an infinite impulse response (IIR) filter. The digital filtering is implemented largely in hardware independent of the number of channels required and/or independent of the required order of the filtering. Thus, filter channels can be added or additional filtering implemented merely by increasing the clock speed without changing the digital filter design. The FIR filter is capable of being reset each frame to prevent a DC buildup at internal nodes. The IIR filter performs a plurality of $2^{nd}$ order biquadratic equations in an overall average of as few as four clock cycles per $2^{nd}$ order biquad. A RAM is used to store the state variables for the $2^{nd}$ order biquadratic equations. The state variable RAM is reset by controlling the clear input of latches at an input and/or the output of the state variable RAM, and the state variable RAM is addressed by a delta counter which is independent of the particular number of filter channels or filter orders implemented. Test patterns may be inserted between functional modules of an integrated circuit such as the disclosed audio codec by appropriate control of the preset and clear inputs to output latches of the functional modules.

13 Claims, 28 Drawing Sheets

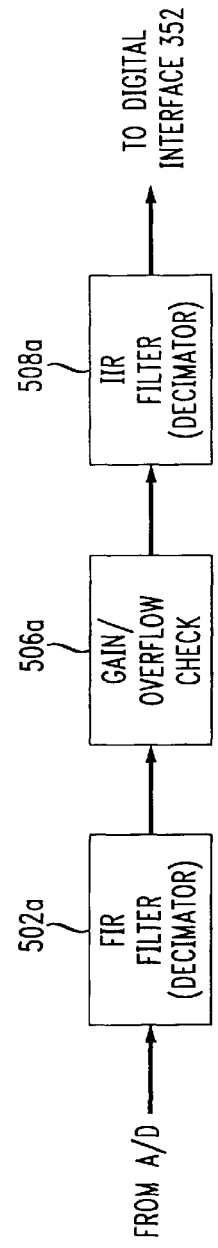
FIG. 5A(1)
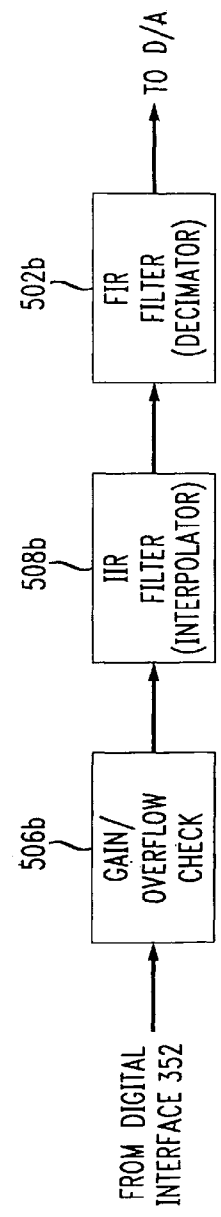
FIG. 5A(2)

STARTUP RESET

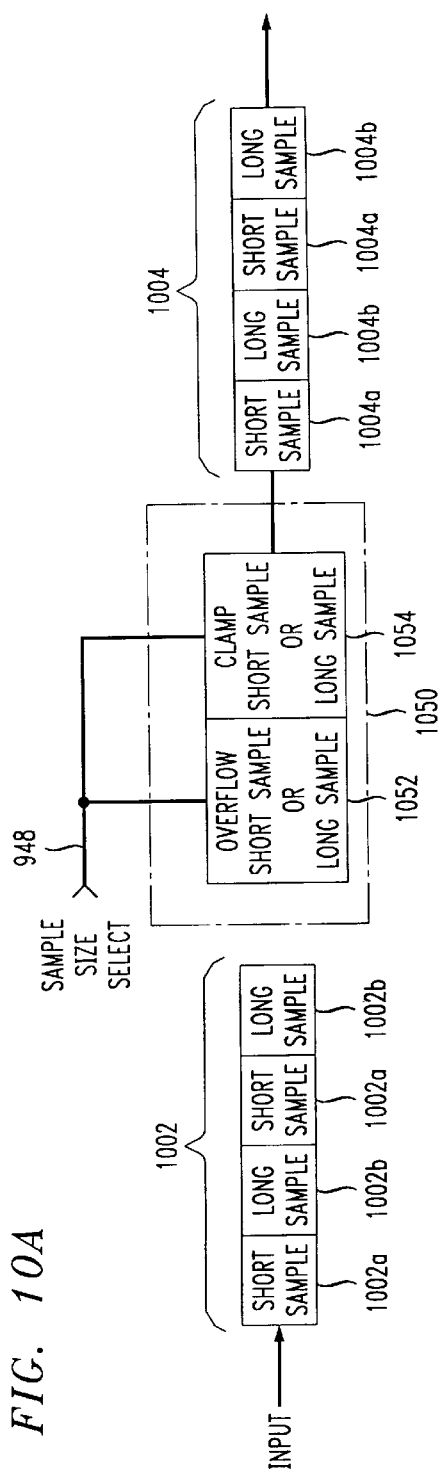
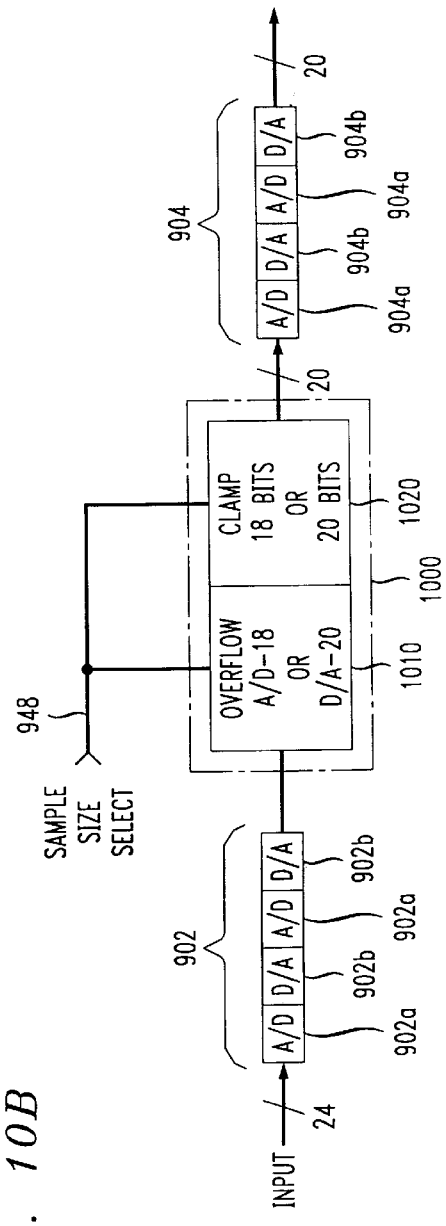
FIG. 10A
FIG. 10B

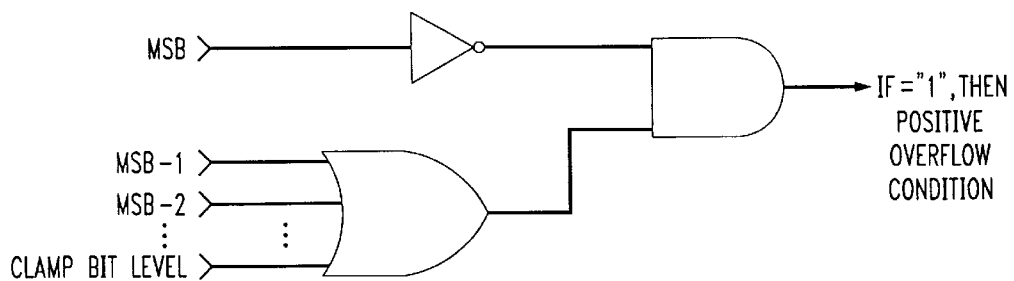
FIG. 11A(1)
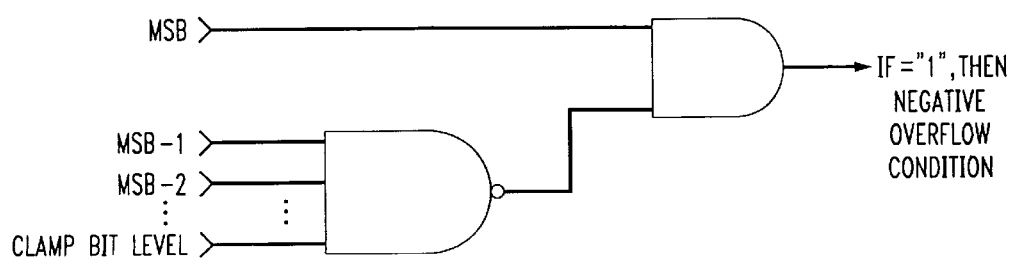
FIG. 11A(2)

FIG. 12A

SHORT SAMPLE (e.g. 18-bit) SAMPLES

| Q22 | Q21-17 | Q16-0 | NRC | NDC | B19-17 | Q16-0 |
|-----|--------|-------|-----|-----|--------|-------|
| 0   | 0      | INPUT | 0   | 1   | 0      | INPUT |
| 0   | ANY 1  | INPUT | 1   | 1   | 0      | +FULL SCALE |
| 1   | ANY 0  | INPUT | 0   | 0   | 1      | −FULL SCALE |
| 1   | 1      | INPUT | 0   | 1   | 1      | INPUT |

FIG. 12B

LONG SAMPLE (e.g. 20-bit) SAMPLES

| Q22 | Q21-19 | Q18-0 | NRC | NDC | B19 | Q18-0 |
|-----|--------|-------|-----|-----|-----|-------|
| 0   | 0      | INPUT | 0   | 1   | 0   | INPUT |
| 0   | ANY 1  | INPUT | 1   | 1   | 0   | +FULL SCALE |
| 1   | ANY 0  | INPUT | 0   | 0   | 1   | −FULL SCALE |
| 1   | 1      | INPUT | 0   | 1   | 1   | INPUT |

2ND ORDER BIQUAD

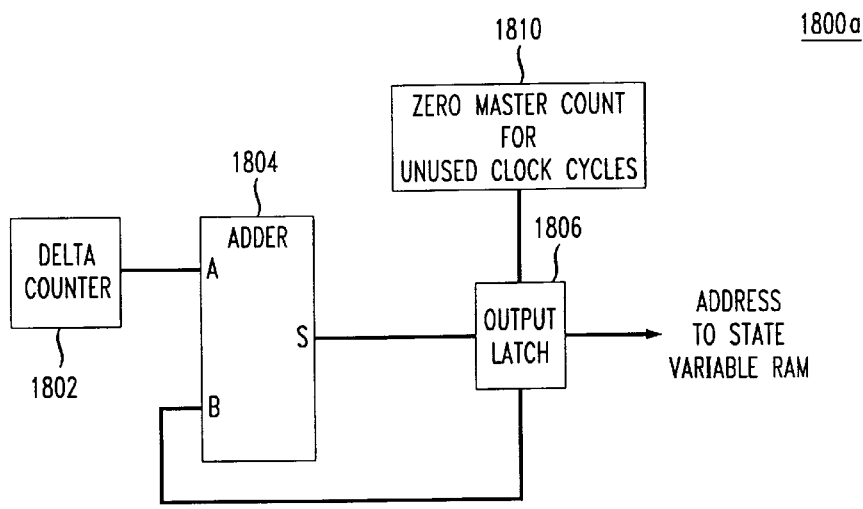
FIG. 18A(1)
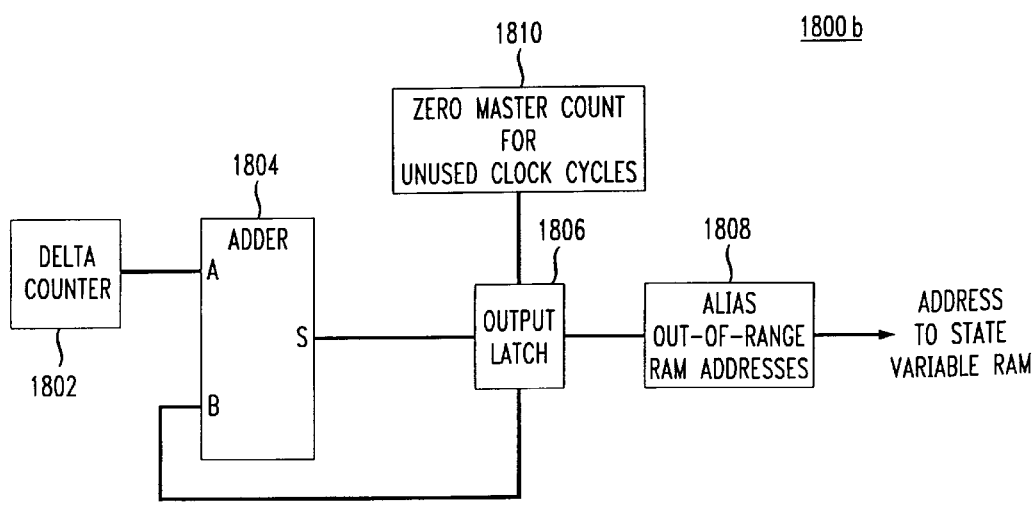
FIG. 18A(2)

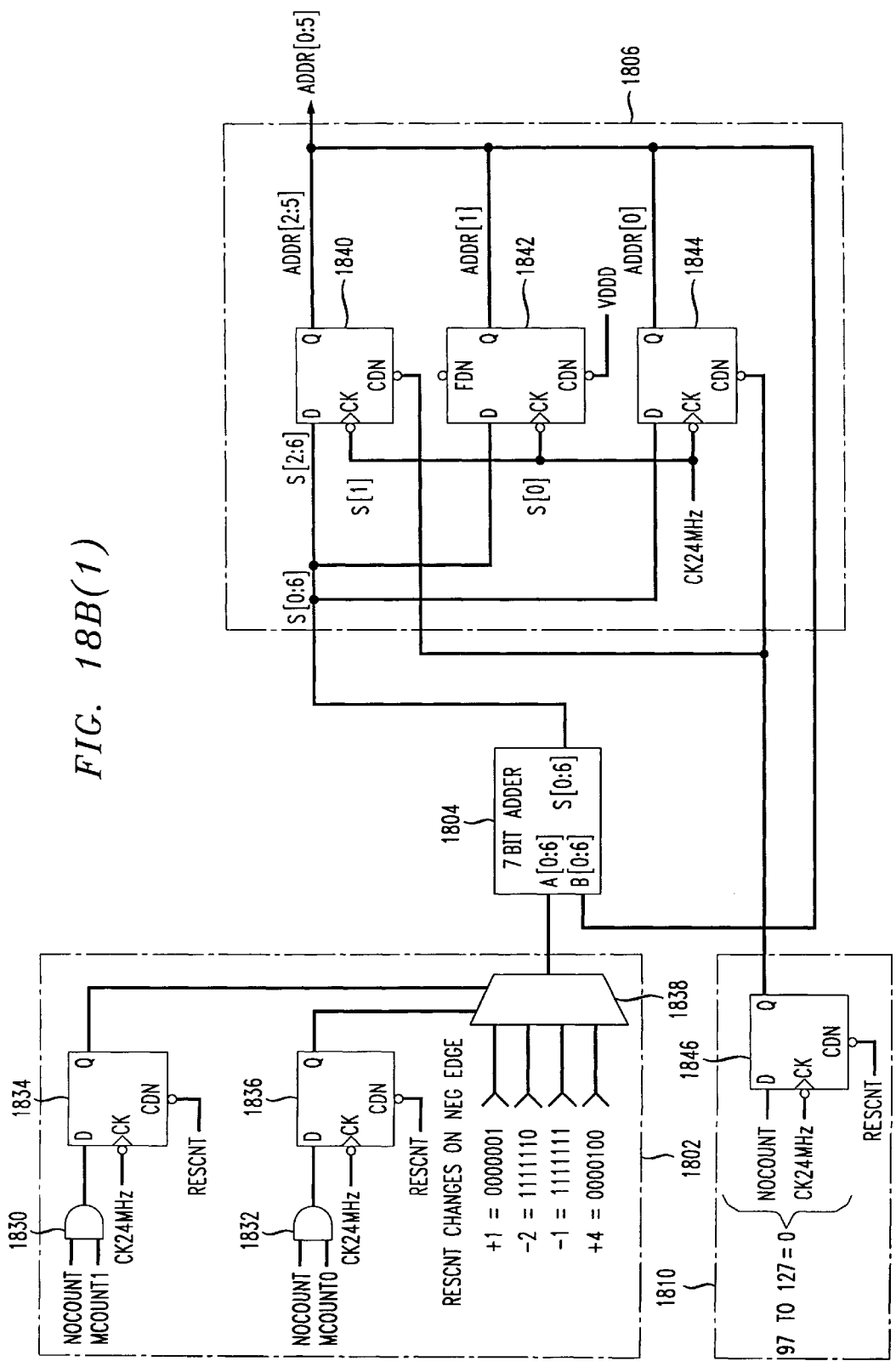
FIG. 18B(1)

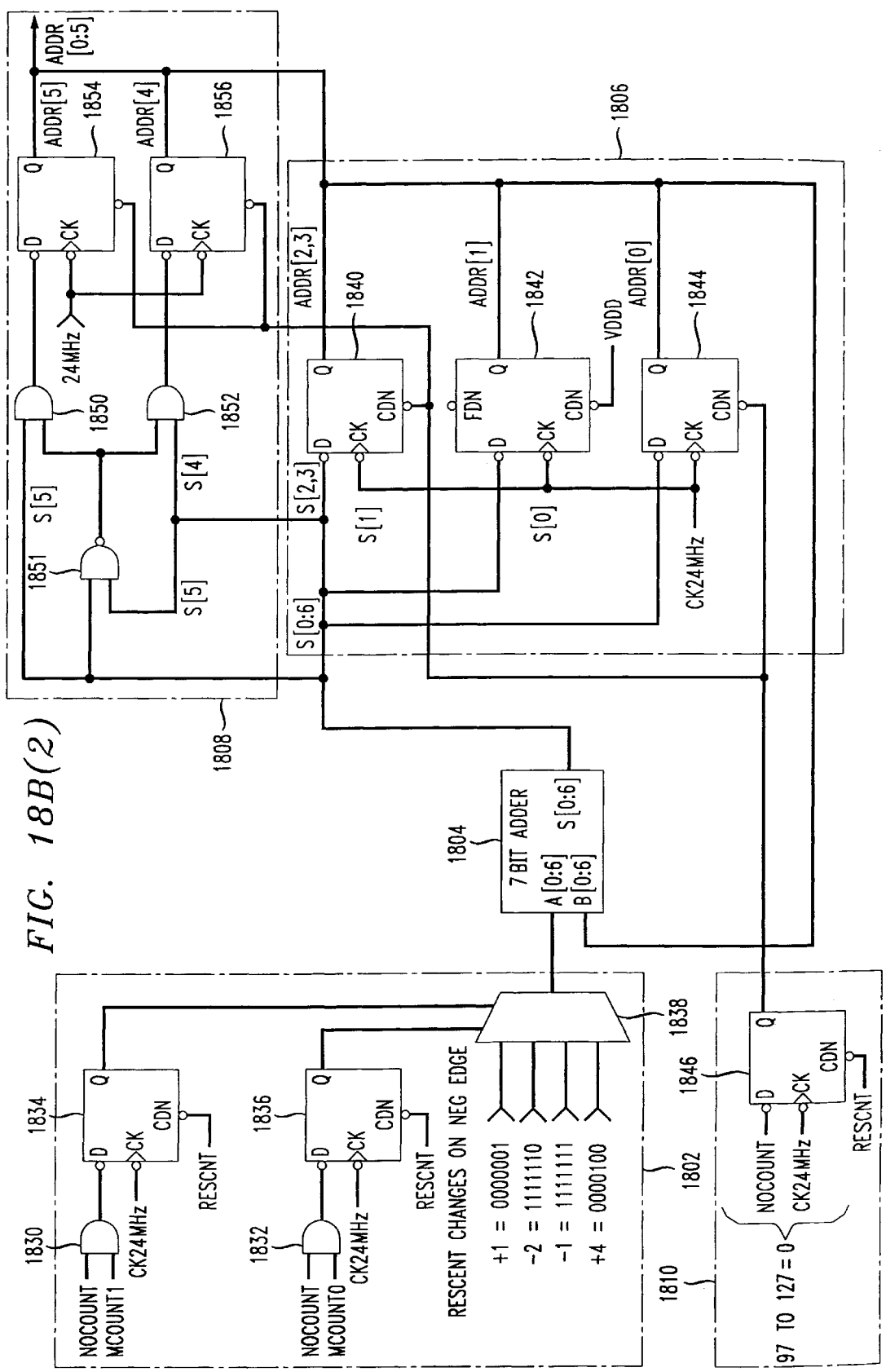
FIG. 18B(2)

| INPUT | | | OUTPUT | | LATCH | |
|---|---|---|---|---|---|---|
| RESET | ENABLE | TEST BIT | CLR | PRE | Q | |
| 0 | X | X | 0 | 1 | 0 | RESET |
| 1 | 0 | X | 1 | 1 | X | NORMAL/OPERATION |
| 1 | 1 | 0 | 0 | 1 | 0 | TEST MODE-INSERT "0" |
| 1 | 1 | 1 | 1 | 0 | 1 | TEST MODE-INSERT "1" |

SYSTEM FOR DIGITAL FILTERING IN A FIXED NUMBER OF CLOCK CYCLES

BACKGROUND OF THE INVENTION

1. Field of the Invention

This invention relates to digital processing and testing techniques, and more particularly to digital processing relating to digital filtering techniques.

2. Background of Related Art

Efficient and inexpensive digitization of telephone grade audio has been accomplished for many years by an integrated device known as a "codec." A codec (short for COder-DECoder) is an integrated circuit or other electronic device which combines the circuits needed to convert analog signals to and from digital signals, e.g., Pulse Code Modulation (PCM) digital signals.

Early codecs converted analog signals at an 8 KHz rate into 8-bit PCM for use in telephony. More recently, the efficiency and low cost advantages of codecs have been expanded to convert analog signals at a 48 KHz sampling rate into 16-bit stereo (and even up to 20-bit stereo) for higher quality use beyond that required for telephony. With higher quality audio capability, today's codecs find practical application in consumer stereo equipment including CD players, modems, computers and digital speakers.

With the development of codecs for these more sophisticated purposes came the need to improve the analog signal-to-noise (S/N) ratio to at least 75 to 90 dB. Improved S/N ratios have been achieved largely by separating the conventional codec into two individual sub-systems and/or two separate integrated circuits (ICs): a controller sub-system handling primarily the digital interface to a host processor, and an analog sub-system handling primarily the interface to, mixing and conversion of analog signals. This split digital/analog architecture has been documented most recently as the "Audio Codec '97 Component Specification", Revision 1.03, Sep. 15, 1996, as revised in "Audio Codec '97", Revision 2.0, Sep. 29, 1997 (collectively referred to herein as "the AC '97 specification"). The AC '97 specification in its entirety is expressly incorporated herein by reference.

FIG. 1 is a generalized block diagram of a conventional split-architecture audio codec conforming to the AC '97 specification. Audio codecs conforming to the AC '97 specification accommodate audio sources from CD players, auxiliary devices such as stereo equipment, microphones and/or telephones.

As shown in FIG. 1, currently known split-architecture audio codecs contemplate a host processor, an audio codec (AC) controller sub-system or IC 402, and an AC analog sub-system or IC 404. The connection between the AC controller sub-system 402 and the AC analog sub-system 404 is currently defined as a five-wire time division multiplexed (TDM) interface controlled by an AC-link 406. The AC controller sub-system 402 may be a stand alone device, or it may be a portion of a larger device such as a Peripheral Component Interconnect (PCI) interface device. PCI is a processor-independent, self-configuring local bus. Alternatively, the AC controller sub-system 402 may be a part of a central processing unit (CPU).

Because of the capabilities of the split digital/analog architecture (i.e., AC controller sub-system 402 and AC analog sub-system 404), the AC '97 specification includes a significant amount of flexibility intended to capture a large market by satisfying many consumer-related audio needs.

For instance, the conventional AC analog sub-system 404 includes interface capability to accept input from multiple sources and to mix the analog signals from those multiple sources. Possible analog signal sources include a CD, video, or telephone line.

FIG. 2A is a diagram showing relevant features of the conventional AC analog sub-system 404. The relevant features include an analog mixing and gain control section 200 accepting input from various analog audio sources 210 including a PC Beep signal, a telephone input, two microphone inputs, a general line in, a signal from a CD player, an analog signal from a video source, and an auxiliary input. The analog mixing and gain control section 200 mixes analog signals input from the various analog audio sources 210, and outputs up to three separate analog channels for digitization in analog-to-digital (A/D) converters 206a, 206b, 206c. A digital interface 202 prepares the mixed, digitized audio signals output from the A/D converters 206a–206c into a serial data stream for transmission via an AC link 406.

In the opposite direction, digital audio signals received from the serial data stream of the AC link 406 by the digital interface 202 are converted back into analog audio signals by digital-to-analog (D/A) converters 204a, 204b, and output to the analog mixing and gain control section 200 for gain control and output on the various desired analog audio source lines 210.

FIG. 2B is a more detailed schematic diagram of the analog mixing and gain control section 200 of the AC analog subsystem 404 shown in FIG. 2A. In FIG. 2B, the analog signals from the analog audio sources 210 are gain adjusted in analog form by analog gain adjusters 300, then mixed in analog mixer 310. A secondary analog mixer 312 allows the inclusion of the PC beep signal and telephone signal into the mixed analog product. The mixed analog signal is gain adjustable in gain adjuster 302 and output from the Analog mixing and gain control module 200 and AC analog sub-system 404. Analog mixer 314 mixes the left and right channels of the summed analog signal to provide a mono signal output, which is gain adjusted in analog gain adjuster 304. Analog mixer 316 similarly provides a mono output from the stereo output signal.

For recording, a multiplexer (MUX) 320 multiplexes signals from the various sources and allows selection of one per channel of the various sources together with a microphone signal for output to a master analog gain adjuster 306. The three gain adjusted analog signals output from MUX 320 are finally converted into digital signals by A/D converters 206a, 206b and 206c. Thus, the mixing and gain control of a conventional AC analog subsystem 404 is typically handled with analog circuitry.

While it is suitable to mix and gain adjust audio signals in analog form for certain applications as shown in FIGS. 2A and 2B, analog features on an integrated circuit require significant amounts of space in the AC analog subsystem 404. Analog circuitry also generally provides a larger source of electrical noise causing cross-talk or other disadvantageous side effects. Thus, to improve a signal to noise ratio of output signals, it is desirable to provide digital testing and processing techniques, e.g., to minimize the analog circuitry in the AC analog subsystem.

SUMMARY OF THE INVENTION

In accordance with the principles of the present invention, a digital filter comprises a multiplier and an adder. A first plurality of latches present latched data samples to the multiplier in each of four multiplier clock cycles; and a second plurality of latches present latched data samples to the adder in each of four adder clock cycles. At least one of the four multiplier clock cycles overlap in time with the four adder clock cycles.

A method of providing a plurality of digital filter channels in a fixed number of clock cycles in accordance with the present invention comprises the performance of three multiplication calculations relating to a first one of the plurality of digital filter channels, in three multiplication clock cycles, respectively. Four addition calculations are performed relating to a first one of said plurality of digital filter channels, in four addition clock cycles, respectively. A result of one of the addition calculations is multiplied by a scaling factor in a fourth multiplication clock cycle to arrive at an output for the first one of the plurality of digital filter channels. At least one of a multiplication calculation and an addition calculation are performed for a second one of the plurality of digital filters simultaneously with at least one of the previous steps of the method.

In another aspect of the methods in accordance with the present invention, a plurality of digital filter channels are provided in a fixed number of clock cycles by performing three multiplication calculations relating to a first one of the plurality of digital filter channels, in three multiplication clock cycles, respectively. Four addition calculations are performed relating to a first one of the plurality of digital filter channels, in four addition clock cycles, respectively. A result of one of the addition calculations is multiplied by a scaling factor in a fourth multiplication clock cycle to arrive at an output for the first one of the plurality of digital filter channels. Substantially simultaneous with the four addition calculations, three multiplication calculations are performed relating to a second one of the plurality of digital filter channels, in three multiplication clock cycles, respectively.

BRIEF DESCRIPTION OF THE DRAWINGS

Features and advantages of the present invention will become apparent to those skilled in the art from the following description with reference to the drawings, in which:

FIGS. 5A(1) and 5A(2) are detailed block diagrams of a filter and gain adjust module in an A/D direction and a D/A direction, respectively, according to the present invention.

FIGS 10A and 10B show an overflow/clamp circuit in accordance with another aspect of the present invention.

FIGS. 11A(1) and 11A(2) show logic for detecting overflow in an embodiment of the circuit of FIGS. 10A and 10B.

FIGS. 12A and 12B are logic diagrams for the overflow/clamp circuit shown in FIG. 11B.

FIG. 18A(1) is a more detailed block diagram showing one embodiment of the state variable RAM address bus generator shown in FIG. 15.

FIG. 18A(2) is a more detailed block diagram showing another embodiment of the state variable RAM address bus generator shown in FIG. 15.

FIG. 18B(1) is a schematic diagram of the embodiment of the state variable RAM address bus generator shown in FIG. 18A(1).

FIG. 18B(2) is a schematic diagram of the embodiment of the state variable RAM address bus generator shown in FIG. 18A(2).

DETAILED DESCRIPTION OF ILLUSTRATIVE EMBODIMENTS

The present invention relates in general to digital testing filtering and other digital functions, e.g., performed between the digitization of analog audio signals and the transmission of the digitized signals over a communication link. While the present invention is described with respect to specific embodiments relating to a split-architecture audio codec in conformance with the AC '97 specification, it relates to digital data testing, processing and filtering in general.

Figure 3:
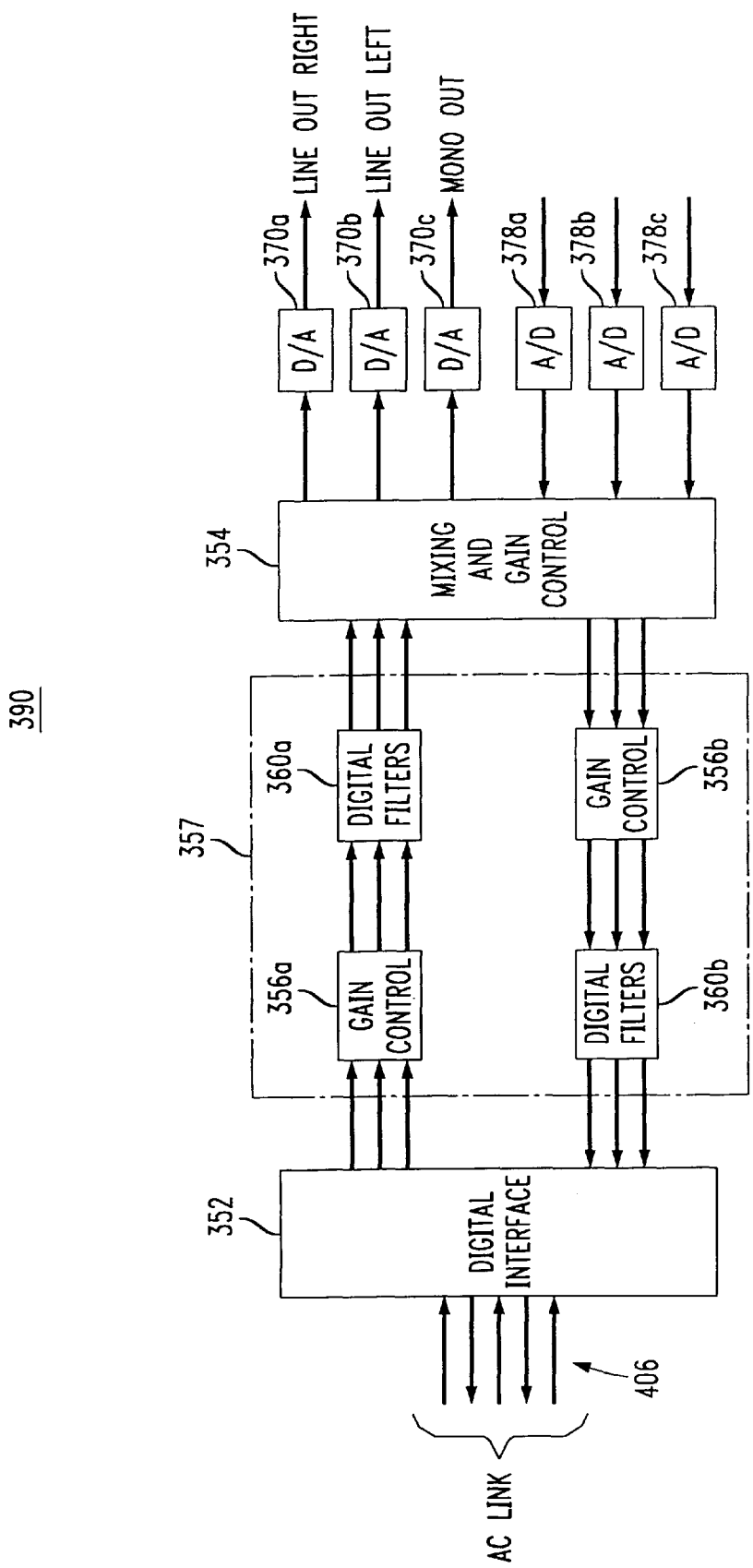
FIG. 3 shows relevant features of an AC analog subsystem in accordance with the principles of the present invention.

FIG. 3 shows relevant features of an AC analog subsystem of a split-architecture audio codec in accordance with the principles of an embodiment of the present invention.

In FIG. 3, an AC analog subsystem 390 includes a digital interface 352, a digital filter and gain module 357 including six channels of gain control 356a, 356b, and six channels of digital filtering 360a, 360b, a digital mixing and gain control module 354, three D/A converters 370a, 370b, 370c, and three A/D converters 378a, 378b, 378c.

Figure 2A:
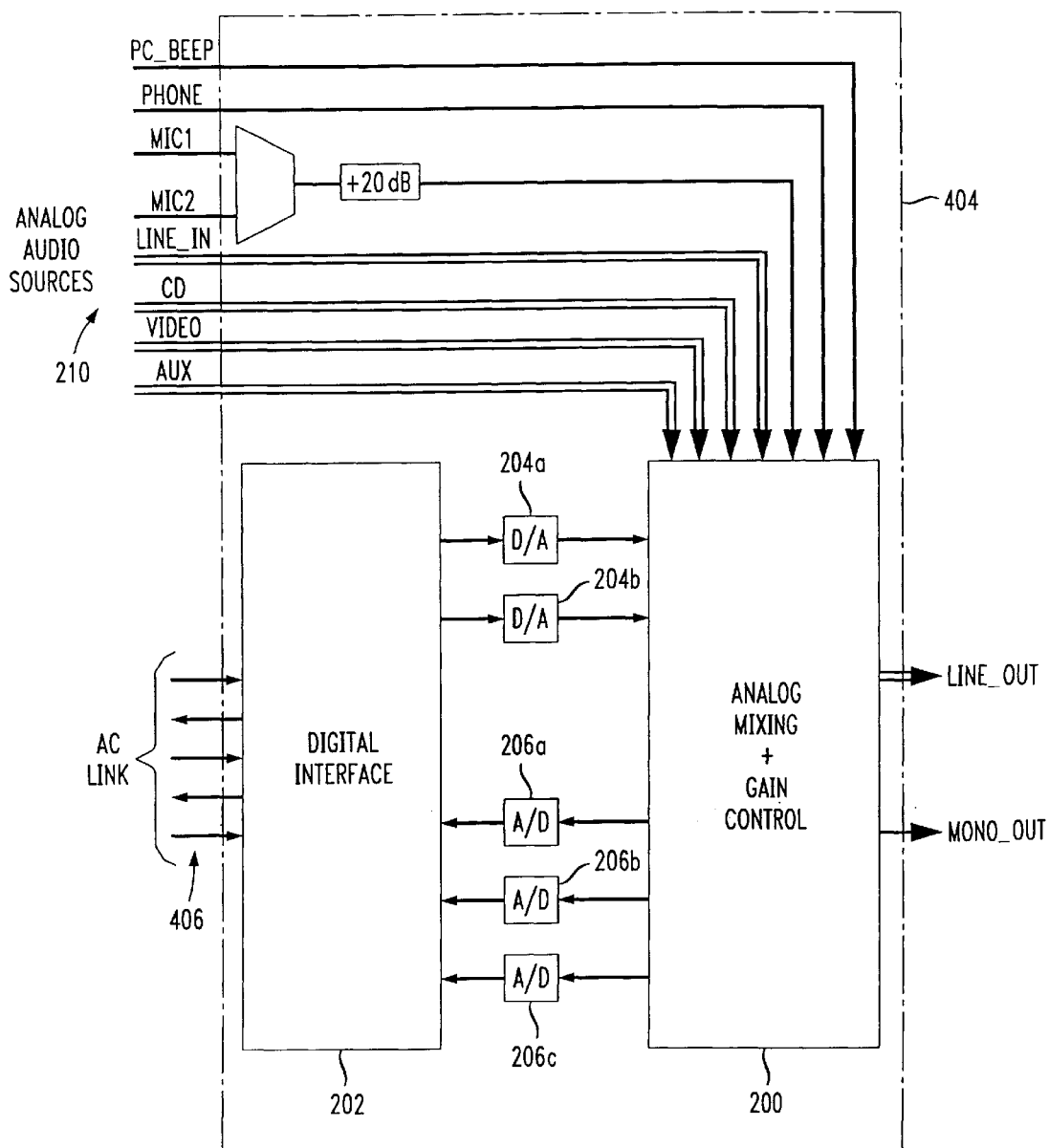
FIG. 2A shows a conventional audio functional module of a conventional audio codec shown in FIG. 1.
Figure 2B:
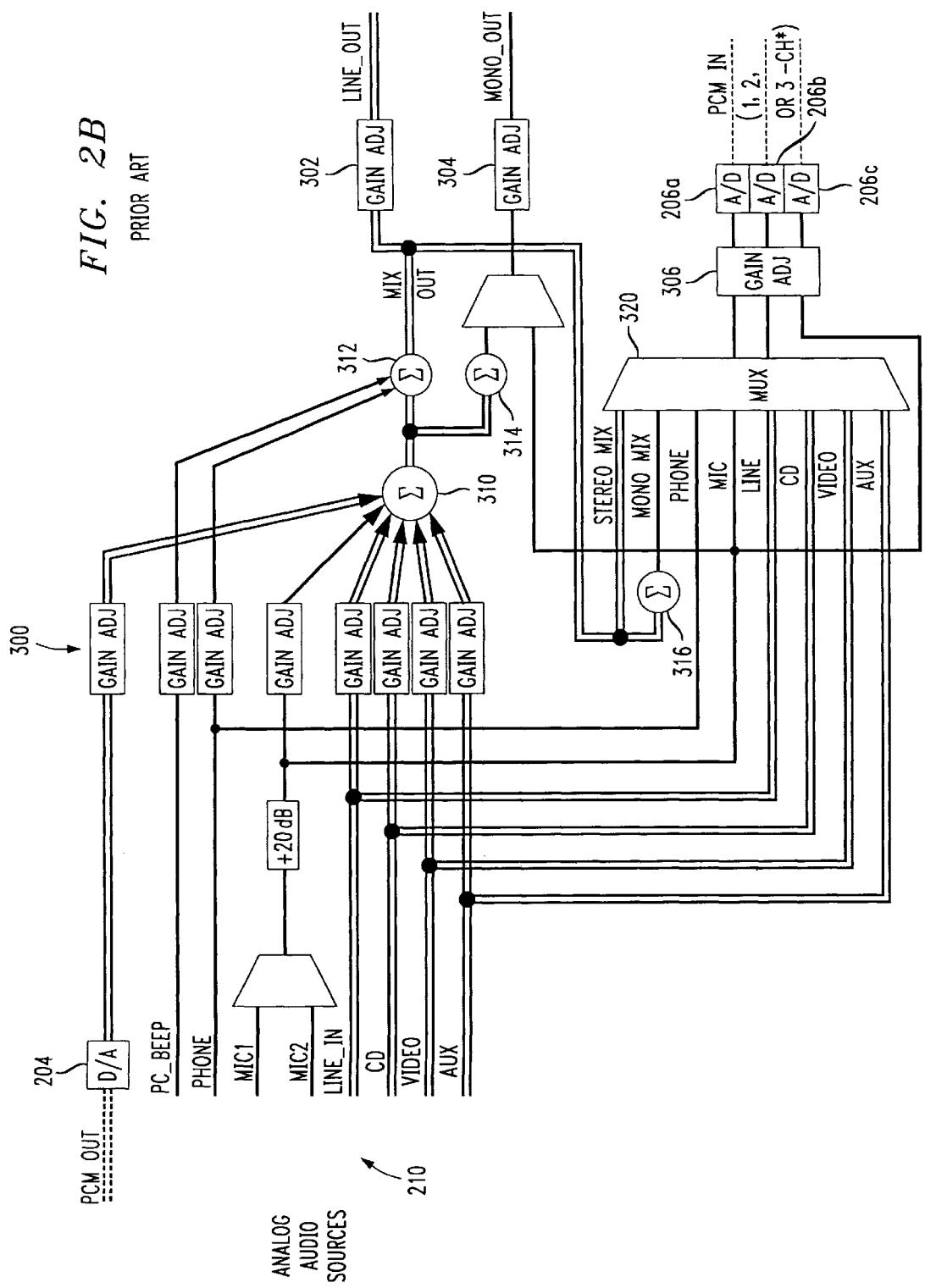
FIG. 2B shows a conventional analog mixing and gain control functional module of a split-architecture audio codec as shown in FIGS. 1 and 2.

The digital interface 352 receives three digital audio signals from the AC link 406 (i.e., left, right and monaural ("mono")), and outputs the same to three channels of the digital gain control module 356a operating in a D/A direction. The digital gain control module 356a provides programmable gain to the digital signals of each channel. For instance, in the disclosed embodiment, between +12 to −46.5 decibels (dB) (i.e., attenuation) of gain, e.g. in 1.5 dB steps, is provided to the digital audio signals before they are each output to appropriate channels of a digital filter module 360a for filtering. After filtering, the three channels of digital audio signals are input to the mixing and gain control module 354 for mixing and additional gain control, if desired. After appropriate mixing with other signals as desired, and after appropriate gain control (e.g., attenuation), the digital audio signals are converted into analog signals in D/A converters 370a, 370b, 370c, and output from the AC analog subsystem 404 (FIG. 2A).

Figure 4:
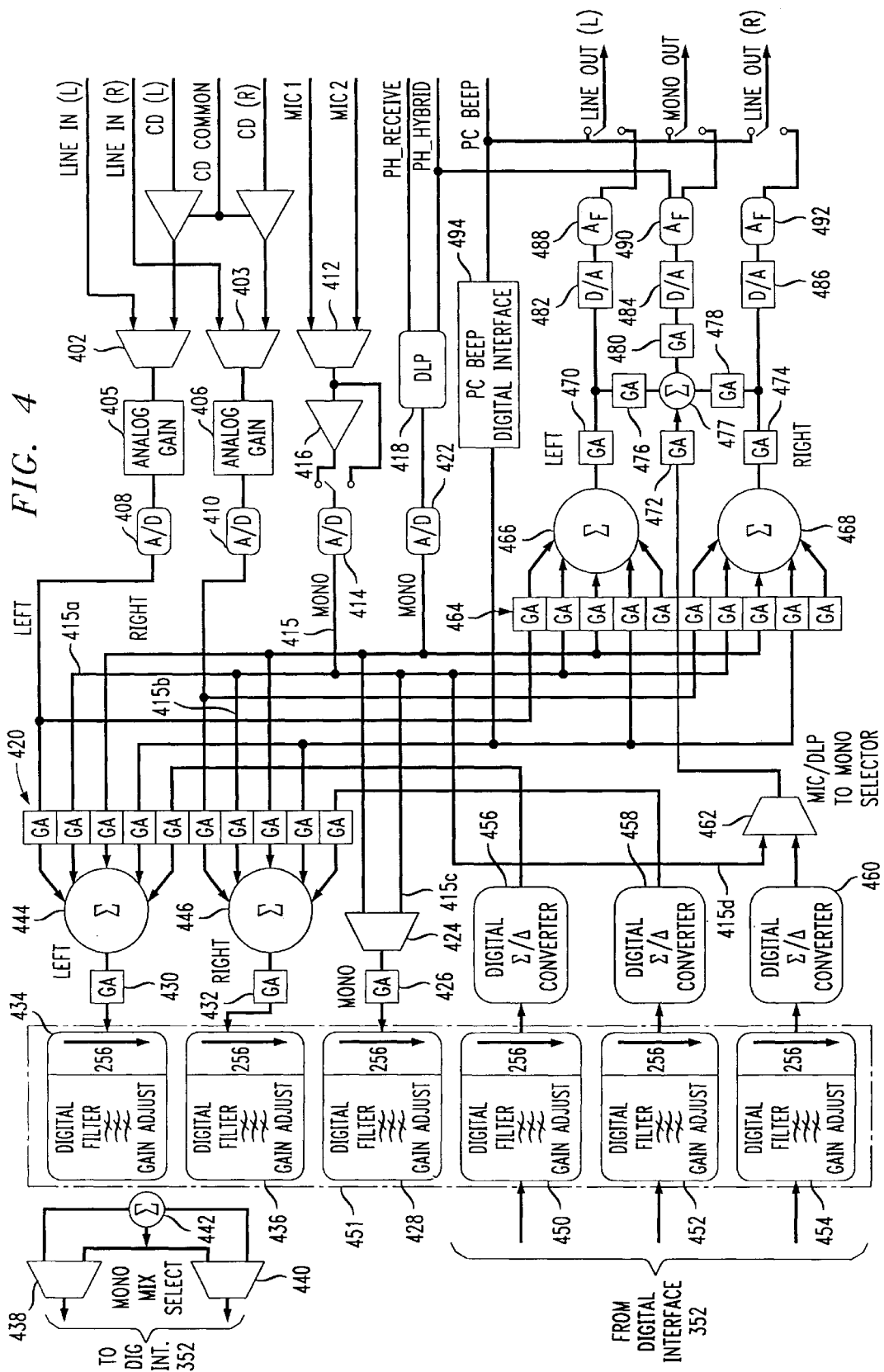
FIG. 4 is a more detailed schematic diagram showing the relevant features of the AC analog subsystem shown in FIG. 3.

FIG. 4 shows the circuit of FIG. 3 in more detail. FIG. 4 shows details of the digital processing both in an A/D direction (upper portion of FIG. 4), and in a D/A direction (lower portion of FIG. 4).

In the A/D direction of FIG. 4, a left (L) and right (R) channel of either a LINE IN signal or a CD signal are selected by multiplexers (MUXs) 402, 403 for input to analog gain modules 405, 406. The analog gain modules 405, 406 are formed by programmable gain adjust modules in the disclosed embodiment, and provide an analog gain of between 0 and 12 dB. Of course, analog gain can be provided in any conventional form, and may alternatively be eliminated entirely, particularly if full conformance with the AC '97 specification is not required in audio codec applications.

The analog signals are output from the analog gain modules 405, 406 to $\Sigma/\Delta$ A/D converters 408, 410, respectively, for digitization. The disclosed $\Sigma/\Delta$ A/D converters 408, 410 input analog signals in a range of 0 to 5 volts and output 1-bit $\Sigma/\Delta$ data at a 12.288 megabit per second (Mb/s) rate. However, it is to be understood that the particular data encoding techniques, analog signal range, sample size and data rate are exemplary only. Aspects of the present invention are equally applicable to differing data encoding techniques, analog signal ranges, sample sizes, and/or data rates.

The left, right, monaural and other audio signals digitized in the A/D direction pass through a bank of digital gain adjusters 420, which each provide a gain adjustment, e.g., of between 0 and −46.5 dB (i.e., an attenuation) for digital signals in respective digital channels, −46.5 dB essentially providing a mute of that audio path. Both banks of digital $\Sigma/\Delta$ gain adjusters 420, 464 provide gain adjustment to input digital signals, e.g., to 1-bit $\Sigma/\Delta$ encoded audio data.

The AC '97 specification requires at least between +12 dB and −46.5 dB of gain in each channel. In the disclosed embodiment, which is in general conformance with the AC '97 specification, positive gain is accomplished in the analog gain modules 405, 406, and negative gain is distributed among several digital gain adjustment modules, first in the gain adjuster module 420, then after summation of left and right channels in digital $\Sigma/\Delta$ mixers 444 and 446 in master channel gain adjusters 430 and 432, and then in the digital filters/gain adjust modules 434, 436 and 428. The master channel gain adjusters 430, 432 and 426 provide a gain adjust of between 0 and −46.5 dB. Of course, but for conformance with the AC '97 specification, any or all of the gain control may be consolidated into fewer modules, distributed over more modules, increased, decreased, and/or eliminated as desired.

Two microphone signals MIC1, MIC2 are input to a multiplexer 412 for selection of either microphone input signal MIC1, MIC2 for further processing. The selected microphone signal output from the microphone MUX 412 passes through two programmable gain adjust modules (not shown), one providing a gain of between 0 and 12 dB, and the other providing a gain of between 0 and 32 dB, and optionally through a filter 416, before being digitized by $\Sigma/\Delta$ A/D converter 414.

Inventively, preferably all positive gain desired in a particular channel is accomplished before digitization. However, because each input channel (e.g., the microphone path 415) may be digitized and fed to as many as five separate destination paths (e.g., microphone destination paths 415a to 415e), this would require as many as five A/D converters each having as many as five corresponding gain adjusters. The present embodiment simplifies the requirements to only a single gain adjuster before a single A/D converter in each input path.

For instance, in the microphone path, instead of the single gain module 416 shown in FIG. 4 placed before the A/D converter 414, conventional techniques would have otherwise required five separate gain modules in each of the destinations 415a–415e. Thus, because each channel may have a different gain value fed to each of a plurality of destinations (e.g., to the left record, right record, mono output, left playback, and right playback), conventional techniques dictate the use of a plurality of separate gain modules for each input. This is undesirable, inter alia, because it requires a significantly larger amount of circuitry.

Instead, as shown in FIG. 4 in accordance with the principles of this embodiment, a single gain adjuster, e.g., 416, in the microphone path 415, is placed in each path. The single gain adjuster 416 handles all overall positive gain for all of the destinations. The single gain adjuster, e.g. 416, is preferably placed in an analog path, e.g., before the A/D converter 414 for the microphone path 415, to take advantage of the lower noise floor before digitization.

The single gain adjuster, e.g., 416, is programmed to provide an amount of positive gain equal to the highest required for any of its output paths, e.g., 415a–415e. Then, to provide flexibility in each channel utilizing the gain adjusted digitized signal, suitable amounts of attenuation is added in subsequent gain adjusters, e.g., 420, 426 and/or 464, to attenuate the digitized signal back down to the desired level.

For instance, if the user of the device programs registers requiring gain for the microphone path 415 as follows:

TABLE I

| PATH | OVERALL GAIN |
| --- | --- |
| Record Right | +12 dB |
| Record Left | +6 dB |
| Record Mic | +3 dB |
| Play Right | −3 dB |
| Play Left | −9 dB |

Then the single gain adjuster 416 is programmed to provide +12 dB of gain for all destinations 415a–415e. Thereafter, suitable attenuation is programmed in any subsequent gain adjuster to reduce the overall gain back to the desired level. For instance, the Record Right path would not have any attenuation added subsequently, the Record Left path would attenuate by 6 dB, e.g., in the corresponding gain adjuster in bank 420, the Record Mic path would attenuate by 9 dB, e.g., in the corresponding gain adjuster in bank 420, the Play Right path would attenuate by 15 dB, e.g., in a corresponding gain adjuster in bank 464, and the Play Left path would attenuate by 21 dB, e.g., in a corresponding gain adjuster in bank 464.

If no destination path, e.g., 415*a*–415*e* requires positive gain, then the single gain adjuster, e.g., 416, is set to provide 0 gain.

The use of a single gain adjuster instead of a plurality of gain adjusters also simplifies the effort by a processor to change gain settings in each gain adjuster, e.g., on a frame-by-frame basis.

A processor such as a microcontroller can be implemented to control the various gain adjusters. For instance, a microcontroller can interpret the overall gain stored in registers by a user, placing all positive gain in the most suitable gain adjusters, e.g., before digitization, and to distribute attenuation among other gain adjusters in the various paths.

The audio codec may also include provisions for input from other audio sources such as a telephone. For instance, a conditioned signal PH_RECEIVE or a telephone line type signal PH_HYBRID may be input to a down-line phone (DLP) interface 418, which includes a hybrid for the telephone line signal. The monaural telephone signal is digitized in a $\Sigma/\Delta$ A/D converter 422.

The output from either the microphone $\Sigma/\Delta$ A/D converter 414 or the telephone $\Sigma/\Delta$ A/D converter 422 is selected in MUX 424 for gain adjustment in gain adjuster 426, and filtering and gain adjustment in digital filter and gain adjuster 428, before being output to the digital interface 352 (FIG. 3).

In the A/D direction as shown in FIG. 3, three channels of analog input signals (e.g., left, right and microphone) are digitized in A/D converters 378*a,* 378*b,* 378*c.* In the disclosed embodiment, the analog signals are in a range of between 0 and 5 volts, but of course may be any appropriate voltage range. The three channels of digital signals from the A/D converters 378*a*–378*c* are mixed and gain controlled in three additional channels of the mixing and gain control module 354, where programmed gain and mixing occurs as in the channels in the D/A direction. The resultant signals are output to the digital interface 352 for transmission on the AC serial link 406.

While it is possible to provide all gain control in a single module, the disclosed embodiment preferably distributes the gain control, e.g., between the mixing and gain control module 354 and gain control modules 356*a,* 356*b.*

The disclosed D/A converters 370*a*–370*c* and A/D converters 378*a,* 378*b,* 378*c* are sigma/delta ($\Sigma/\Delta$) converters accepting (D/A) and providing (A/D) 1-bit data samples at a desired sampling rate, e.g., 12.288 Mb/s. The digital $\Sigma/\Delta$ mixers 444, 446, 466, 468 (FIG. 4) digitally mix the respectively input digital signals for the various sources. The digital signals are mixed, e.g., at data rates of 12.288 Mb/s.

While 12.288 Mb/s is a preferred data rate for the $\Sigma/\Delta$ converter in the disclosed embodiment, it is in no way the only data rate possible. It is to be understood by those of skill in the art that this (and other) data rates disclosed herein are by way of example only.

The digital processing within the mixing and gain control module 354, the digital filters 360*a,* 360*b,* and the gain control modules 356*a,* 356*b* is performed on the digital audio samples, e.g., $\Sigma/\Delta$ encoded digital data. Of course, certain aspects of the present invention are equally applicable to processing data which is encoded using various techniques, not just $\Sigma/\Delta$, and having many sample sizes, not just 1-, 18- or 20-bit samples.

The disclosed audio codec embodiment utilizes $\Sigma/\Delta$ encoding to encode an analog signal into 1-bit samples. Sigma-delta ($\Sigma/\Delta$) converters (sometimes referred to as delta-sigma ($\Sigma/\Delta$) converters by those of skill in the art) are well known. One advantage of using $\Sigma/\Delta$ D/A and A/D converters is to facilitate easy-to-manufacture digital circuitry along with low-precision analog circuitry, allowing for highly integrated D/A and A/D converters to be created primarily with digital techniques. One conventional publication describing conventional $\Sigma/\Delta$ A/D and D/A converters is "Analog-to-Digital Conversion-A Practical Approach" by Kevin M. Daugherty, McGraw-Hill, Inc. (1994), which is expressly incorporated herein by reference.

Similar circuitry is present for three channels in the opposite direction, i.e., in the D/A direction wherein digital audio channels from the digital interface 352 provide digital signals for output from the AC analog subsystem in analog form. In this direction, in the disclosed embodiment, digital filter/gain adjusters 450, 452, 454 filter and gain adjust audio channels, e.g., the left, right and monaural channels, respectively, from the digital interface 352. The digital signals are converted, e.g., into $\Sigma/\Delta$ encoded single bit samples in digital-to-digital $\Sigma/\Delta$ converters 456, 458, 460. A monaural MUX 462 selects between the mono signal from the digital interface 352 and the selected microphone input from the microphone A/D $\Sigma/\Delta$ converter 414. A bank of gain adjusters 464 respectively digitally gain adjust individual channels, e.g., from 0 to −46.5 dB, and the gain adjusted output is summed in digital $\Sigma/\Delta$ mixers 466, 468. Master gain adjusters 470, 472, 474 provide a gain adjustment, e.g., of 0 to −46.5 dB for each of the audio channels before conversion to analog in D/A $\Sigma/\Delta$ converters 482, 484, 486. The D/A $\Sigma/\Delta$ converters 482, 484, 486 each receive, e.g., 12.288 MHz 1-bit $\Sigma/\Delta$ data and output an analog signal in a range, e.g., of between 0 and 5 volts.

Digital summer 477 adds signals from a left and right channel to form a monaural signal, which is gain adjusted in gain adjuster 480.

While FIGS. 3 and 4 show the processing of six digital audio channels, i.e., three in the A/D direction and three in the D/A direction, the present invention is equally applicable to any number of channels of digital processing in either the A/D direction and/or the D/A direction.

Analog filters 488, 490, 492 provide analog filtering of the signals before output from the AC analog subsystem by rejecting out-of-band energy, e.g., audio signals beyond 20 KHz. For instance, in the disclosed embodiment, line out left, line out right, and monaural signals are output from the AC analog subsystem. The analog filters 488, 490, 492 may be altered or eliminated as desired.

The digital filter/gain adjuster modules 434, 436, 428, 450, 452 and 454 form, e.g., six separate filter channels of a common digital filtering module 451. More or fewer channels may be provided as necessary to provide the desired number of digital filter functions, but for conformance with the AC '97 specification. Each of the digital filter/gain adjuster channels 434, 436, 428, 450, 452, and 454 filters out or eliminates out-of-band (e.g., over 20 KHz) energy in the digital signal. The filter channels also provide a decimation or interpolation function, decreasing or increasing the data rate, respectively. In the A/D direction, digital filter gain adjuster modules 434, 436, 428 provide a decimation of the data samples to a lower data rate, while the digital filters 450, 452 and 454 in the D/A direction provide an interpolation of the data samples.

Each digital filter/gain adjuster module 434, 436, 428, 450, 452 and 454 comprises, e.g., two separate filters: A two-stage decimation finite impulse response (FIR) filter, and an infinite impulse response (IIR) filter. Preferably, after filtering, the digital signal in each channel contains energy only in the desired range, e.g., in the 0 to 20 kilohertz (KHz) range, with a desired out-of-band rejection, e.g., of approximately at least −74 dB. Of course, the pass band and/or out-of-band rejection level may be adjusted to suit particular applications. An FIR filter and an IIR filter are both utilized because they are complementary to one another. The IIR filter provides the desired out-of-band rejection, e.g., of at least about −74 dB, but has repeating images at the filter rate, e.g., every 192 KHz. The FIR filter, while not contributing as significantly to the out-of-band rejection in the disclosed embodiment, eliminates the repeating images caused by the IIR filter.

A digital gain adjustment may be provided with the FIR filter and IIR filter in each channel. For instance, in the disclosed embodiment, a user programmable gain of either 0, −6, −12 or −18 dB is provided in each channel of the common digital filtering modules 451. Of course, the digital gain adjustment may be eliminated, but for conformance with the AC '97 specification, if desired.

A primary purpose of the filters 434, 436, 428 in the A/D direction is decimation, and the primary purpose of the filters 450, 452, 454 in the D/A direction is interpolation. The FIR filter and IIR filter in each channel of the common digital filtering module 451 in the A/D direction reduces (or decimates) the data rate from 12.288 Mb/s to 48 Kb/s. The decimation is distributed between the FIR filter and the IIR filter in the preferred embodiment, but may be carried more fully or entirely either by the FIR filter or the IIR filter. In the disclosed embodiment, the FIR filter in each of the three digital filter/gain adjust modules 434, 436, 428 in the A/D direction decimates by 64, and the IIR filter in these digital filter/gain adjust modules 434, 436, 428 decimates by 4. In the D/A direction, the FIR and IIR filters interpolate by 64 and 4, respectively. Therefore, the data rate output from the FIR filter is, e.g., 192 Kb/s, and the data rate output from the IIR filter is, e.g., 48 Kb/s, which is the final data rate of the AC link 406 (FIG. 3). Of course, decimation and interpolation may be performed between data rates other than to 48 Kb/s if full conformance with the AC link of the AC '97 specification is not desired.

The FIR and IIR filters are implemented in hardware in the disclosed embodiment, e.g., in a field programmable gate array (FPGA). Alternatively, the functions of the FIR and IIR filters may be performed in a processor such as a digital signal processor (DSP). The FIR and IIR filtering and other details of conventional digital filter/gain adjuster modules are disclosed in more detail in U.S. Pat. No. 5,457,456, entitled "A Data Converter with Programmable Decimation of Interpolation", the content of which is explicitly incorporated herein by reference.

The digital-to-digital $\Sigma/\Delta$ converters 456, 458, 460 receive, e.g., 20-bit $\Sigma/\Delta$ encoded data samples at, e.g., a 12.288 MHz data rate, and convert the same into 1-bit $\Sigma/\Delta$ encoded data samples at the same rate, e.g., 12.288 Mb/s.

The digital $\Sigma/\Delta$ mixers 444, 446, 466, 468 are all identical in nature and provide completely asymmetrical mixing capabilities so that different audio signals may be mixed in the A/D direction (e.g., the record path) than that mixed in the D/A direction (e.g., the playback path). As will be discussed in greater detail below, the digital $\Sigma/\Delta$ mixers 444, 446, 466, 468 each inventively contain overflow protection.

Figure 5B:
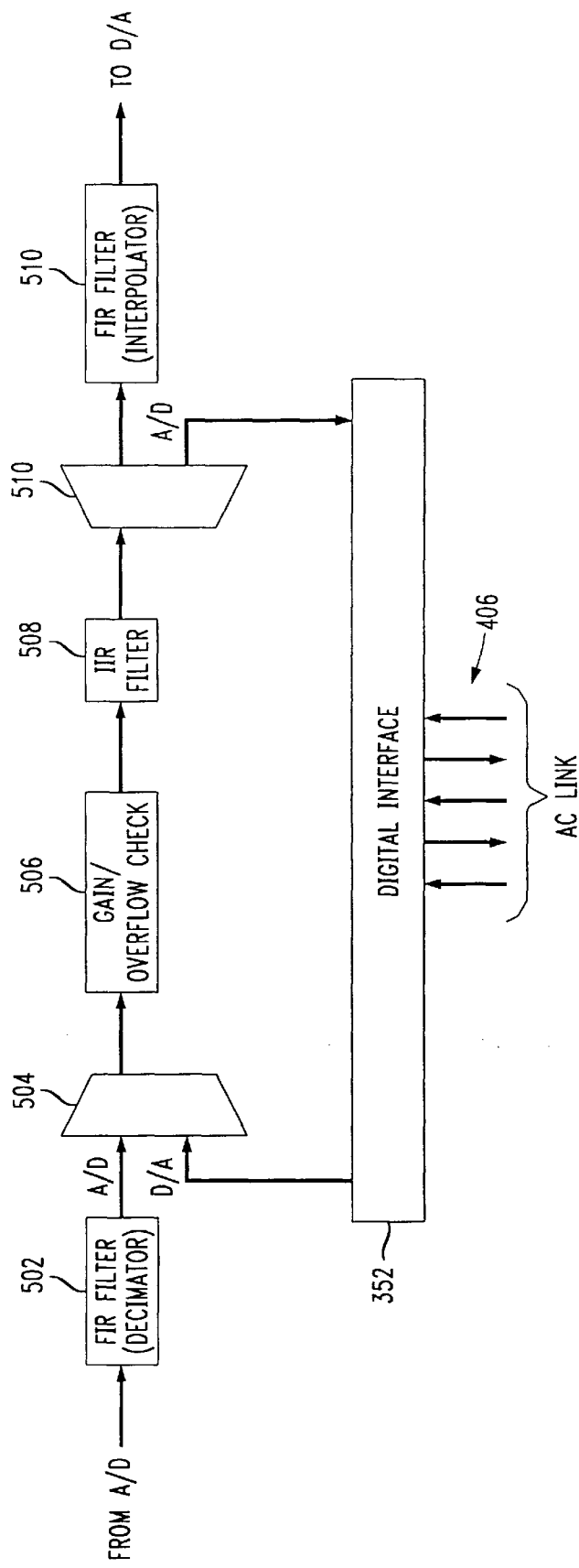
FIG. 5B shows in more detail a filter and gain adjust of the embodiment of the present invention shown in FIG. 4.

The digital filter/gain adjust modules 434, 436, 428, 450, 452 and 454 are shown in greater detail in FIGS. 5A(1), 5A(2) and 5B. FIG. 5A(1) depicts the signal flow of the filtering channels in the A/D (i.e., decimation) direction, while FIG. 5A(2) depicts the signal flow of the filtering channels in the D/A (i.e., interpolation) direction. FIG. 5B shows a more efficient utilization of hardware resources implemented in the disclosed embodiments wherein common circuitry is used for filtering and gain control in both the A/D and D/A directions.

FIG. 5A(1) depicts each of the individual filter and gain adjust channels 434, 436 and 428 in the A/D direction, while FIG. 5A(2) depicts each of the individual filter and gain adjust channels 450, 452 and 454 in the D/A direction.

In FIG. 5A(1), data from an A/D converter, e.g., 12.288 Mb/s 1-bit $\Sigma/\Delta$ encoded data samples, is input to an FIR filter 502a operating as a decimator. The FIR filter 502a decimates the A/D signal from 1-bit $\Sigma/\Delta$ encoded data samples at 12.288 Mb/s to 18-bit linear data samples at 192 Kb/s. The 18-bit linear data samples are output at 192 Kb/s from the FIR filter 502a and input to a gain/overflow module 506a, which provides gain and inventively checks to determine and provide correction for overflow in the digital samples, as will be discussed in greater detail herein below. The digital gain/overflow module 506a allows, e.g., the insertion of 0, −6, −12 or −18 dB gain (i.e., attenuation).

The gain/overflow module outputs data samples, e.g., at 192 Kb/s to an IIR filter 508a, which is operated in a decimating mode for samples in the A/D direction. The IIR filter 508a decimates, e.g., the 20-bit linear data samples at 192 Kb/s by 4 to provide 20-bit linear data samples at 48 Kb/s. The IIR filter has a gain of 4 in the A/D direction, and a gain of 0.8 in the D/A direction.

FIG. 5A(2) shows the process flow in the D/A (i.e., interpolation) direction. In this direction, in the disclosed embodiment, 20-bit linear data samples are output at, e.g., 48 Kb/s from a sample source, e.g., the digital interface 352, and provided to a gain/overflow module 506b. The gain/overflow module 506b provides gain and checks against overflow, as provided by the gain/overflow module 506a in the A/D direction.

In the D/A direction, e.g., 20-bit 48 Kb/s data samples are interpolated by 4 in the IIR filter 508b. Accordingly, 20-bit linear data samples are output from the IIR filter 508b at 192 Kb/s and directed to an FIR filter 502b. The FIR filter 502b interpolates, e.g., the 20-bit samples from 192 Kb/s to 12.288 Mb/s for output toward a D/A converter.

For ease of design, common circuitry in the filter channels in either the A/D (i.e. decimation) direction or D/A (i.e. interpolation) direction may be commonly utilized. For instance, samples in the A/D direction may be multiplexed with samples in the D/A direction, and appropriately processed within common filtering components. The common filtering components include appropriate control signaling to indicate the direction of the current samples, e.g., the A/D direction or D/A direction.

In particular, FIG. 5B shows a digital filter channel capable of operation in either an A/D direction or a D/A direction. Control of the processing is multiplexed between interpolation and decimation, with appropriate latching of samples and switching of multiplexing functions 504, 510 as necessary.

In FIG. 5B, a multiplexer function (MUX) 504 alternately selects for output either an A/D direction sample from the FIR filter 502 operating as a decimator, or a D/A direction sample from, e.g., the digital interface 352. Thus, since the disclosed embodiment includes an equal number of filtering channels in both the A/D and D/A directions, every other sample output from the MUX 504 is a 18-bit, 192 Kb/s data sample from the FIR filter 502, and the alternating every other sample output from the MUX 504 is a 20-bit, 48 Kb/s sample from the digital interface 352. The MUX 504 samples alternately between the A/D and D/A directions because of the symmetry provided by three filter channels in each direction in the present embodiment of an audio codec. However, the particular number of decimation channels and the particular number of interpolation channels may be altered in accordance with the principles of the present invention.

The disclosed embodiment includes an IIR filter 508 to accomplish high out-of-band rejection, e.g., greater than about −74 dB of rejection. The FIR filters 502, 510 in the disclosed embodiment are implemented as comb filters because of ease of design.

All or most of the decimation or interpolation performed in each digital filter/gain adjustment module 434, 436, 428, 450, 452 and 454 may be performed in either the FIR filter 502, 510 or the IIR filter 508. Moreover, while the FIR filters 502, 510 in the disclosed embodiments are comb filters, other filter types may be implemented within the principles of the present invention.

Figure 6:
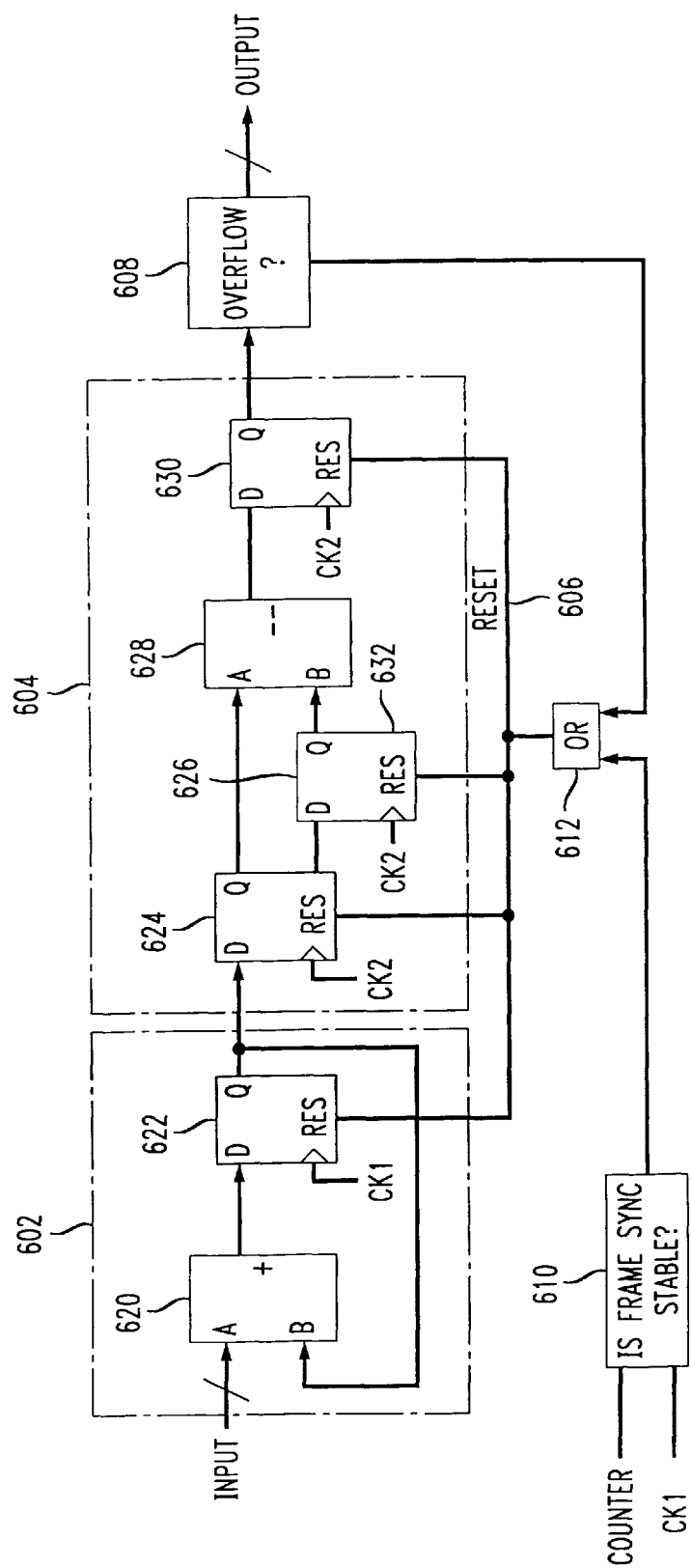
FIG. 6 shows a sync decimation filter in accordance with the principles of the present invention.

FIG. 6 shows the comb filter of the FIR filters 502, 510 of the present invention in greater detail. In particular, this comb filter is commonly referred to as a SINC$^3$ filter, and has a pole on the unit circle. The comb filter of the disclosed embodiment implements the following SINC$^3$ function:

$$\left(\frac{1-Z^{-N}}{1-Z^{-1}}\right)^3$$

wherein N is the decimation or interpolation rate. A SINC$^3$ filter is a common way of referring to a comb filter with a transfer function which has zeroes at the decimation (or interpolation) rate so that every 192 KHz, the attenuation of the transfer function becomes infinity.

While a conventional comb or SINC$^3$ filter may be implemented, conventional SINC$^3$ filters are disadvantageous in that if any discontinuity in the input data is present, i.e., if the input data becomes unsynchronized, a DC value builds up inside the filter and does not leak off. Unfortunately, this DC buildup eventually causes the filter to overload. The inventive SINC$^3$ filter shown in FIG. 6 prevents DC buildup by resetting if the comb filter control signals are unstable, i.e., not synchronous, or if an overflow has occurred in the SINC$^3$ filter. If either condition is true, the SINC$^3$ filter is caused to reset to avoid a DC buildup.

Figure 1:
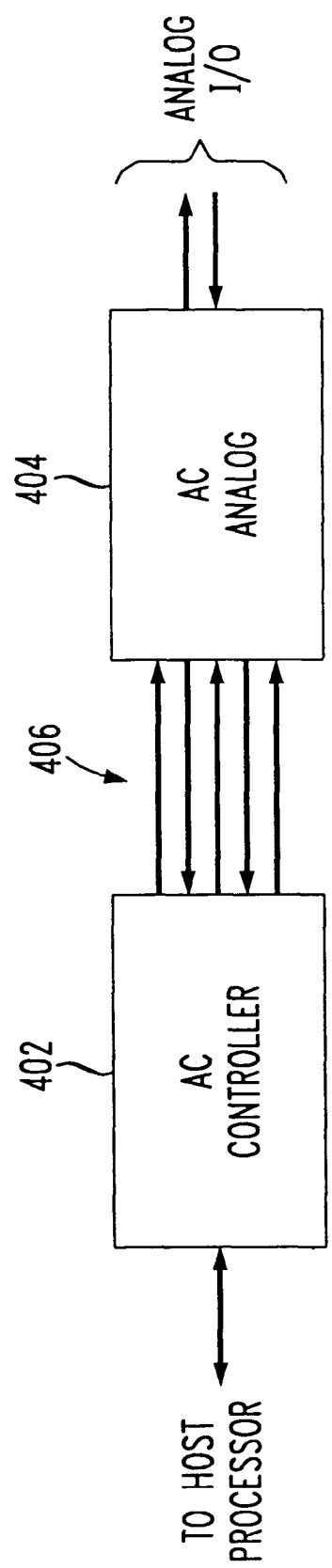
FIG. 1 shows a conventional split-architecture audio codec.

Asynchronous conditions do not generally occur within the same integrated circuit because of the proximity and predictability of the elements. However, asynchronous conditions are possible when separate integrated circuits are interfaced together, e.g., the AC controller 402 and the AC analog 404 of a conventional audio codec (FIG. 1). For instance, in the split-architecture audio codec, a frame signal is generated in the AC controller and AC link, which is transmitted to the AC analog for generation of a lower speed clock. The externally generated frame signal may contain noise or jitter causing asynchronous operation of the comb filter.

The inventive SINC$^3$ filter shown in FIG. 6 is implemented in two stages: one stage 602 is recursive operating under the control of a high speed oversampling clock CK1 (e.g., a 12.288 Mb/s clock), and another stage 604 operates under the control of a lower speed clock CK2 (e.g., a 192 Kb/s clock). The decimation or interpolation rate N is equal to CK1/CK2. The stages 602, 604 shown in FIG. 6 are repeated three times to provide a SINC$^3$ filter forming the FIR filters 502, 510 in an embodiment of the present invention. A decimating SINC$^3$ is shown in FIG. 6, while an interpolating SINC$^3$ filter has the stages 602, 604 reversed from that shown in FIG. 6.

The recursive stage 602 of the SINC$^3$ filter is comprised of an adder circuit 620, and an output latch 622 to latch the output of the adder circuit 620 on the transition of the higher speed clock CK1. The output stage 604 of the SINC$^3$ filter is comprised of an input latch 624 to latch a first input to a subtractor 628, and a second latch to latch the output of the first input latch 624 for input to the other input of the subtractor 628. The output of the subtractor 628 is latched in a latch 630, for output to the overflow detector 608.

The recursive stage 602 operating under the control of the higher speed clock CK1 implements the transfer function $1/(1-Z^{-1})$, while the output stage 604 operating under the control of the lower speed clock CK2 implements the transfer function $(1-Z^{-N})$. When the stages 602 and 604 are placed in series as shown in FIG. 6, the desired SINC$^3$ transfer function results.

In order for the SINC$^3$ filter to properly track the input signal, the recursive stage 602 must not operate for more than N cycles without a pulse of the lower speed clock CK2. A problem occurs when the system synchronization signal (e.g., a framing signal) is noisy, jittery or otherwise occurs asynchronously. This condition may otherwise cause erroneous resetting of the control logic signals too early or too late. When this happens, the lower speed clock CK2 may not be generated during the next frame, allowing the recursive stage 602 of the SINC$^3$ filter to operate for up to 2N−1 clock cycles without a new pulse of the lower speed clock CK2. However, any operation after N clock cycles will result in a DC buildup on the internal nodes of the SINC$^3$ filters.

The present invention solves the problem of a DC buildup on the internal nodes of the SINC$^3$ filters by including detection of an asynchronous condition and causing a reset of the SINC$^3$ filter when asynchronous operation of the synchronization signal is detected.

In the disclosed SINC$^3$ filter, a reset signal on reset line 606 is input to both stages 602, 604 of the SINC$^3$ filter when an asynchronous condition is detected, to reset the internal nodes of the SINC$^3$ filter, thus preventing a DC buildup.

In the disclosed embodiment, the reset signal on reset line 606 may be generated by the detection of an overflow in the output sample by an overflow detector 608 at the output of the SINC$^3$ filter. Overflow is determined in the overflow detector 608, e.g., by the detection that the most significant bit (MSB) and the next to most significant bit (MSB-1) are not the same.

An added benefit of resetting the SINC$^3$ filter upon overflow of the output sample is that an overflow clamp circuit is not necessary, thus saving logic in hardware implementations.

A count detector 610 may alternatively detect asynchronous operation and cause a reset signal to reset the internal nodes of the SINC$^3$ filter. The count detector 610, which itself is reset upon each pulse of the lower speed clock CK2, compares a counter corresponding to a number of bits in each frame to an incoming synchronizing signal, e.g., the framing signal, to detect stability in the synchronizing signal. Thus, if the framing signal is not detected at the point expected as determined by the value of the counter, a reset signal is generated to reset the SINC$^3$ filter.

Either the overflow detector 608 or the count detector 610 can cause reset of the SINC$^3$ filter through an OR function 612 in the disclosed embodiment. While the present embodiment resets the SINC³ filter upon detection of either an overflow in an output sample or an absence of a framing signal, resetting the internal nodes of a SINC³ filter upon any detection of an asynchronous condition is within the principles of the present invention. After reset, the disclosed SINC³ filters forming the FIR filters 502, 510 typically require about three frames to re-start and achieve a steady state of operation.

Figure 7:
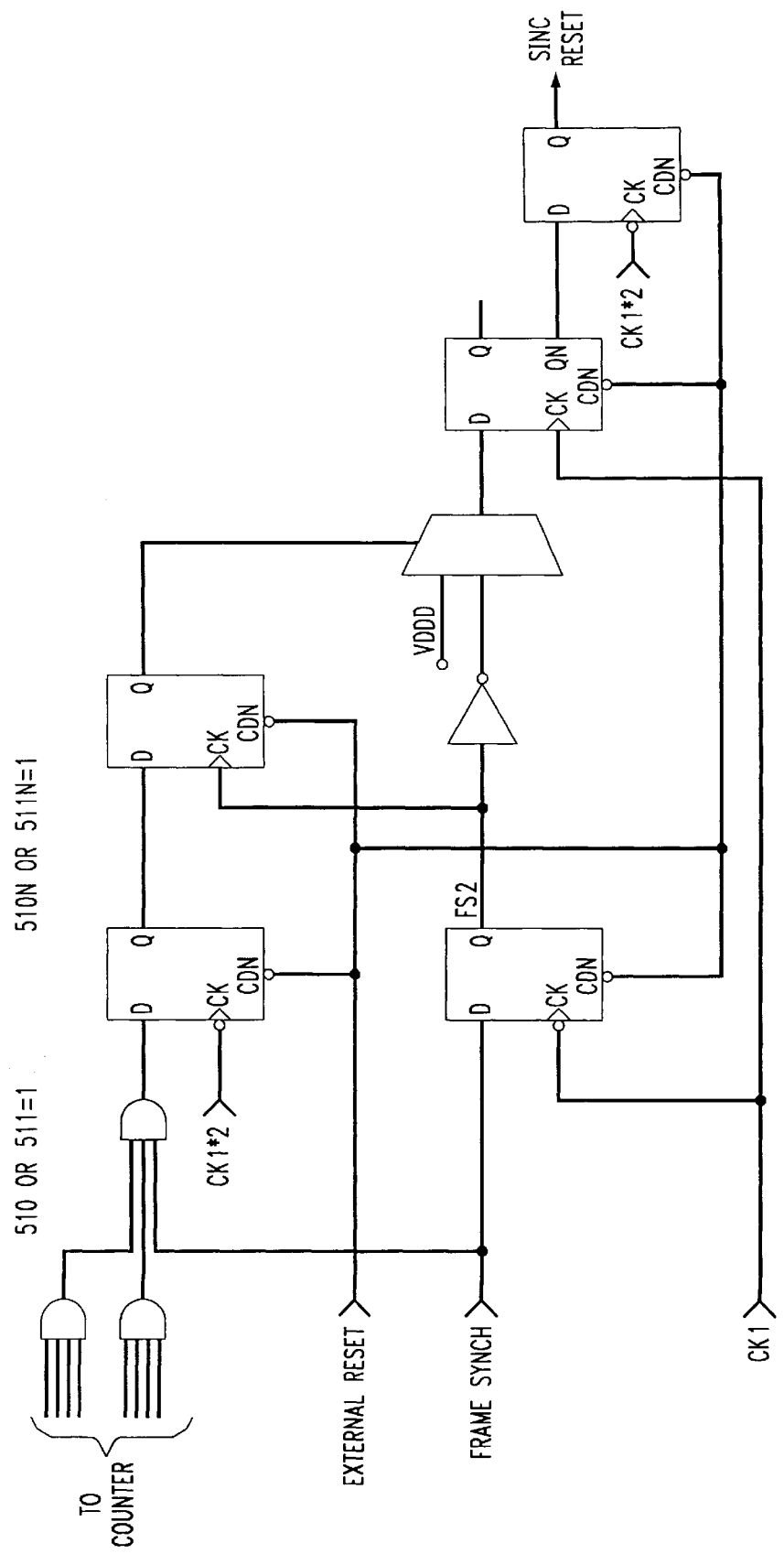
FIG. 7 shows in more detail an embodiment of the count detector for generating a reset signal to a $SINC^3$ filter shown in FIG. 6 in accordance with another aspect of the present.

FIG. 7 shows in more detail one embodiment of the count detector 610 for generating a reset signal to the SINC³ filter. In particular, a master counter signal, e.g., counting from 0 to 511 every frame of, e.g., 48 KHz, provides a reference to indicate when a synchronizing signal such as a framing signal should be present. If the synchronizing signal is not present when expected, e.g., when the counter is at 510 or 511, then an output reset pulse is generated, which in turn resets all internal nodes of the SINC³ filter as well as the counter signal input to the count detector 610, to restart the SINC³ filter.

Figure 8A:
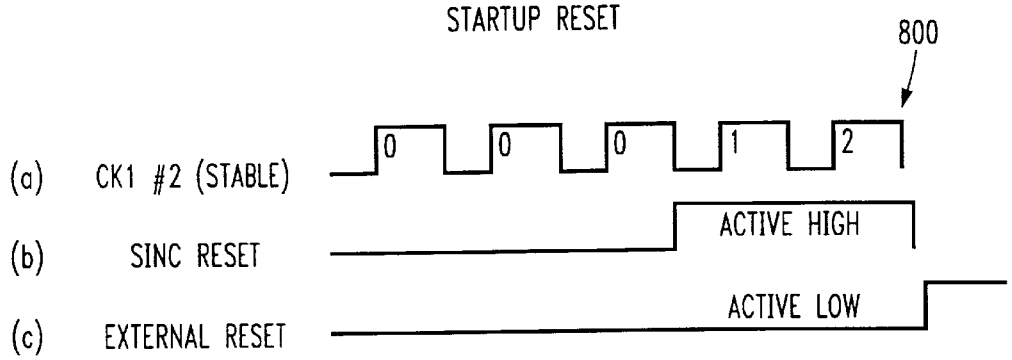
FIGS. 8A and 8B are timing diagrams for the count detector of the FIR filters shown in FIG. 7.
Figure 8B:
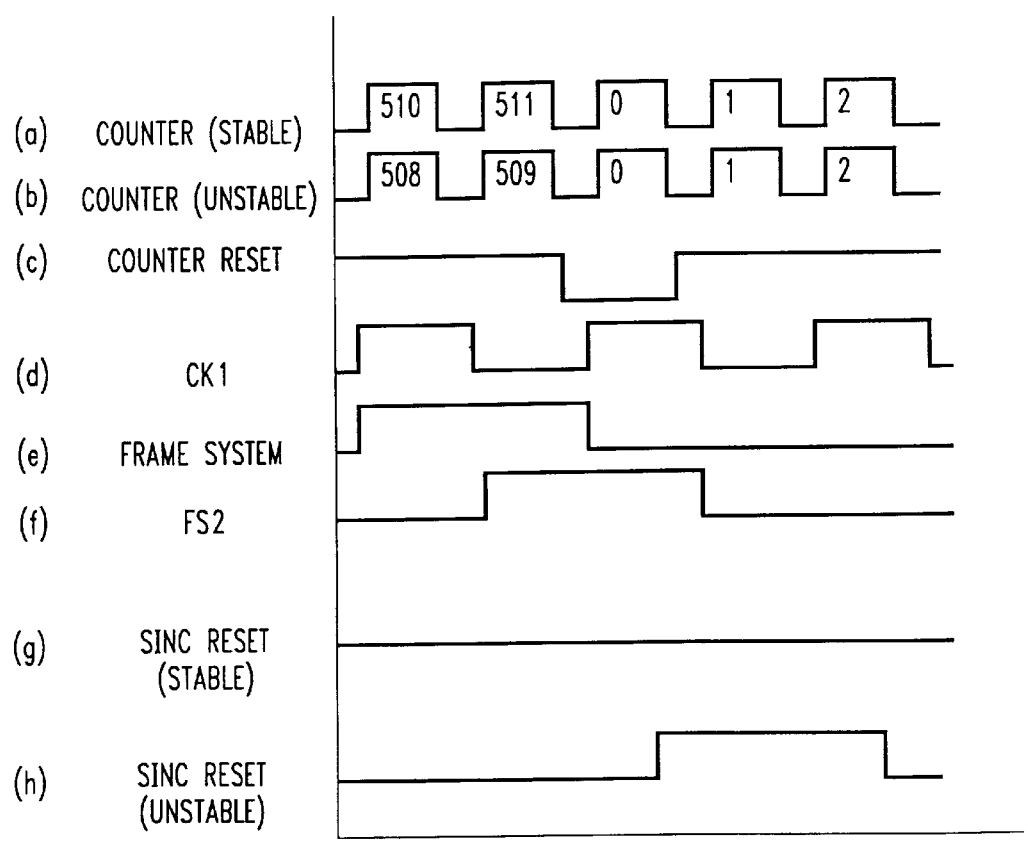

FIGS. 8A and 8B are timing diagrams for the count detector 610 of the FIR filters 502 and 510 shown in FIG. 7.

In FIG. 8A, waveform (a) shows a clock signal used to form the counter at system startup. Operation of the FIR filters 502, 510 and IIR filter 508 starts at point 800. Waveform (b) shows the active output of the count detector 610 shown in FIG. 7 at system startup, and waveform (c) shows the release of an active low external reset applied to the count detector 610 at system startup.

In FIG. 8B, waveforms (a), (c), (d), (e), (f), and (g) represent a stable, i.e. normal, condition of the SINC³ filter, while waveforms (b), (c), (d), (e), (f), and (h) represent an unstable condition which would otherwise likely lead to a DC buildup on the internal nodes of the SINC³ filter if not reset in accordance with the principles of the present invention.

In the stable condition, the counter reaches 510 and 511 as shown in waveform (a), and a frame synch signal shown in waveform (e) is properly detected. Thus, because the frame synch signal appears when the counter reaches, e.g., either 510 or 511, the count detector 610 does not activate a reset signal as shown in waveform (g).

However, in the unstable condition, as shown in waveform (b) the counter fails to reach the expected count, e.g., 510, before the frame synch signal becomes active as shown in waveform (e). As a result, the count detector 610 activates an output reset signal as shown in waveform (h) of FIG. 8B.

The gain/overflow module 506 (FIG. 5B) will now be described in more detail, with reference to FIGS. 9, 10, 11A(1), 11A(2), 11B, 12A and 12B.

Figure 9:
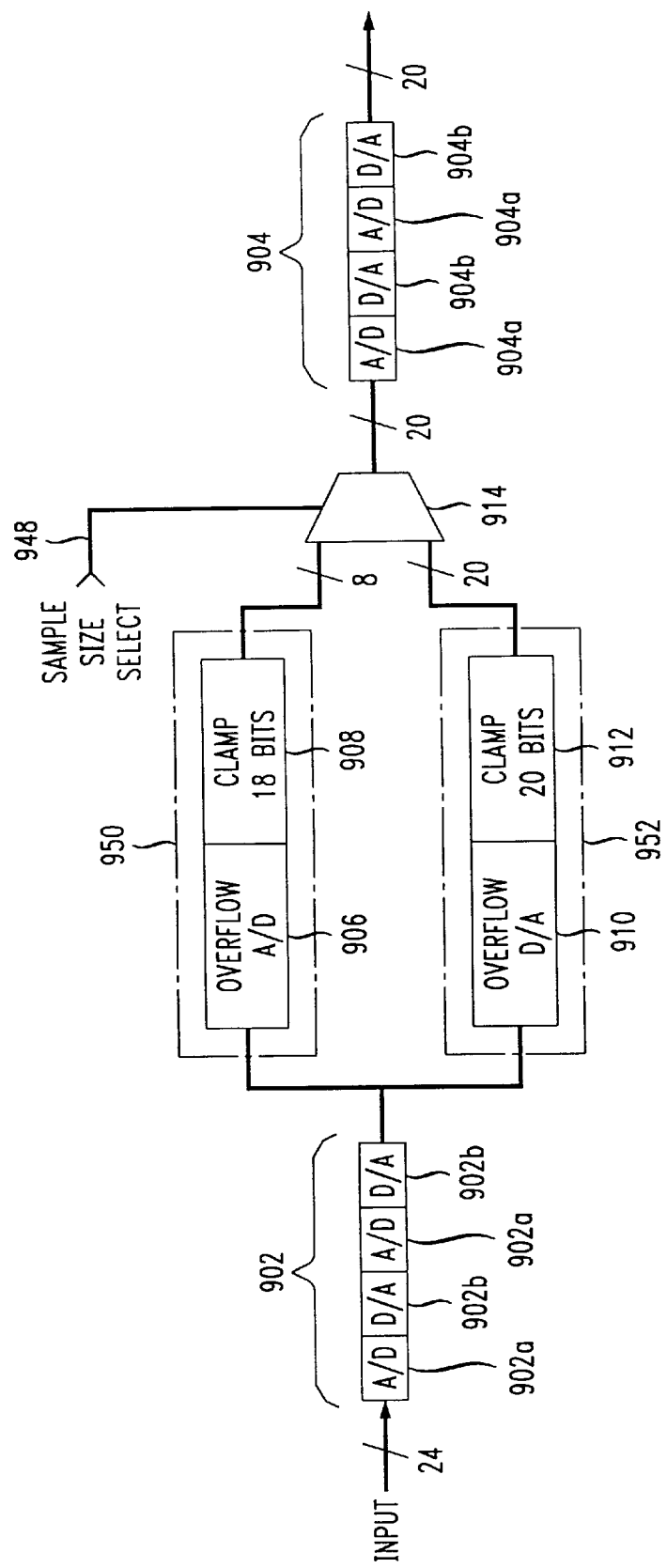
FIG. 9 shows a overflow/clamp circuit as applied to the disclosed embodiment of the present invention.

FIG. 9 shows separate multiplexing overflow clamp circuits applied to the configuration of the present invention. In FIG. 9, a data stream 902 containing data samples to be clamped to at least two different data sample lengths is input to appropriately sized overflow/clamp circuits, e.g., to both an 18-bit overflow/clamp circuit 950 and a 20-bit overflow/ clamp circuit 952. The data stream 902 is comprised, e.g. of shorter 18-bit Σ/Δ encoded data samples (A/D direction samples) 902a and longer 20-bit Σ/Δ encoded data samples (D/A direction samples) 902b. Although the shorter and longer data samples 902a, 902b are described as, e.g., 18- and 20-bits in length, respectively, it is to be understood that the lengths of these data samples internal to the relevant circuit, e.g., the digital filters/gain adjust modules 434, 436, 428, 450, 452 and 454 (FIG. 4), may be significantly larger to preserve overflow information until properly detected and clamped in the gain/overflow check module 506 (FIG. 5B). Accordingly, in the disclosed embodiment, the data stream 902 containing both 18- and 20-bit data samples is passed on a 23 bit data bus, and clamped to the appropriate length, e.g., 18- and 20-bits, respectively.

The shorter data samples 902a and longer data samples 902b are alternately applied to the 18- and 20-bit overflow/ clamp circuits 950, 952 for processing. While the present embodiment shows alternate application of shorter data samples 902a and longer data samples 902b, the sequence of samples may be changed in accordance with the number of channels desired in each direction. For instance, if one D/A channel and five A/D channels are desired, the appropriate multiplexing of the data stream 902 would include one longer (e.g., D/A direction) sample for every five shorter (e.g., A/D direction) samples.

A difficulty in the detection of overflow and clamping of the digital samples derives from the different length samples. For instance, in the disclosed embodiment, 20-bit data samples are processed in the D/A direction, while 18-bit data samples are processed in the A/D direction. Thus, different overflow/clamp circuits 950, 952 are typically necessary to clamp the different length data samples. In the typical circuit shown in FIG. 9, an output multiplexer 914 selects either an overflow/clamped 18-bit A/D sample 904a from the overflow/clamp circuit 950 for output in a time slot of an output data stream 904, or an overflow/clamped 20-bit D/A sample 904b from the overflow/clamp circuit 952 for output in a time slot of the output data stream 904. As shown, the MUX 914 alternates between the A/D direction samples 904a and the D/A direction samples 904b based on an alternating control signal 948 corresponding to the multiplexed timing required for the processing of an even number of A/D and D/A direction samples.

The 18-bit overflow/clamp circuit 950 detects bit overflow beyond 18-bits of data typically caused by digital processing, or added gain to a level beyond that which can be represented by 18-bits of data. If the bits extend beyond 18-bits, the numerical value of the data sample "wraps around" to an erroneous value. For instance, for 20-bit two's complement digital samples, the overflow/clamp circuit 950 would determine if the sample exceeded $+2^{17}$ (i.e., 011111111111111111) or $-2^{17}$ (i.e., 100000000000000000) and if so it would clamp to 18-bits by replacing the exceeded sample with $+2^{17}$ or $-2^{17}$, respectively. Thus, upon overflow detection the wrapped-around erroneous data sample is replaced by a maximum or minimum binary value having, e.g., 18-bits.

Similarly, the 20-bit overflow/clamp circuit 952 detects bit overflow beyond 20-bits of data, and if detected replaces the wrapped-around erroneous data sample with a maximum or minimum 20-bit value as appropriate. In this example, the overflow/clamp circuit 952 would determine if the sample exceeded $+2^{19}$ (i.e., 01111111111111111111)or $-2^{19}$ (i.e., 10000000000000000000), and if so it would clamp to 20-bits by replacing the exceeded sample with $+2^{19}$ or $-2^{19}$, respectively.

Clamping the digital samples is important in the present embodiment to prevent overflow information from entering the IIR filter 508 (FIG. 5B) for processing, otherwise the overflow might become magnified by the IIR filter 508. Unfortunately, the inclusion of two (or more) separate overflow/clamp circuits 950, 952 requires an excessive amount of circuitry in hardware implementations, or excessive routines if implemented in software, e.g., in a DSP. Moreover, the requirement for a multiplexer 914 to select output signals adds complexity, decreases reliability, and significantly adds a delay to the output data stream 904.

A preferred overflow/clamp circuit 1000 is shown in FIG. 10A, with a specific embodiment for the present embodiment shown in FIG. 10B. FIG. 10A shows an overflow/clamp circuit 1050 which checks for overflow and clamps either a short data sample or a long data sample based on a sample size select signal 948.

In particular, an input data stream 1002 contains short data samples 1002a and long data samples 1002b, which are processed by an overflow short or long data sample module 1052, and clamped by a short sample/long sample clamp module 1054, based on the sample select size control signal 948. Thereafter, a multiplexed output data stream 1004 is output containing overflow-checked and clamped short samples 1004a, and overflow-checked and clamped long samples 1004b.

FIG. 10B is a species of the system shown in FIG. 10A corresponding to the disclosed embodiment. In the particular embodiment shown in FIG. 10B, the multiplexed input data stream 902 is input, and a multiplexed output data stream 904 is output as described with respect to FIG. 9. However, the overflow checking and clamping is inventively combined into a single overflow/clamp circuit 1000 to process data samples having different clamped lengths.

In particular, instead of multiplexing the outputs from separate overflow/clamp circuits 950, 952 as shown in FIG. 9 based on a control signal 948 indicating the length of the data sample being processed, overflow checking for all length output data samples is combined into a combined overflow/check module 1000 including a combined overflow/check module 1010 and a combined clamping module 1020. The processed data sample lengths of both the combined overflow checking module 1010 and the combined clamping module 1020 are controlled by the control signal 948.

It has been found that the combined overflow/clamp circuit 1000 shown in FIG. 10B results in about a 40 percent (%) reduction in the logic necessary to implement the circuit in hardware as opposed to the separate overflow/clamp circuits 950, 952 shown in FIG. 9.

FIGS. 11A(1) and 11A(2) comprise an overflow short or long data sample module 1052 (FIG. 10A). FIG. 11A(1) shows a logic diagram for detecting a positive overflow condition, and FIG. 11A(2) shows a logic diagram for detecting a negative overflow condition. While the logic of FIGS. 11A(1) and 11A(2) is carried out in hardware in the disclosed embodiment, it is within the principles of the present invention to comprise the short or long data sample module 1052 (FIG. 10A) in software, e.g., in a DSP, to perform the logic shown in FIGS. 11A(1) and 11A(2).

In FIG. 11A(1), a positive overflow is detected when the most significant bit input to the overflow/clamp circuit 1050 (i.e., the sign bit or the $23^{rd}$ data bit in the disclosed embodiment) is a logic "0", and any of the data bits lower than the MSB input down to and including the clamped bit level (i.e., the $18^{th}$ bit in the A/D direction and the $20^{th}$ bit in the D/A direction in the disclosed embodiment) is a logic "1". This condition indicates a positive overflow of the data sample beyond the clamped bit level, and determines an output of a positive full scale data sample at the length of the output data samples.

In FIG. 11A(2), a negative overflow is detected when the most significant bit input to the overflow/clamp circuit 1050 (i.e., the sign bit or the $23^{rd}$ data bit in the disclosed embodiment) is a logic "1", and all of the data bits lower than the MSB input down to and including the clamped bit level (i.e., the $18^{th}$ bit in the A/D direction and the $20^{th}$ bit in the D/A direction in the disclosed embodiment) are at a logic "1". This condition indicates a negative overflow of the data sample beyond the clamped bit level, and determines an output of a negative full scale data sample at the length of the output data samples.

If an overflow condition is not indicated, the lowest data bits, i.e. those in common between the shortest and longest data samples being tested for overflow, pass through and are output in the output data samples at the same bit positions as were the bit positions in the input data samples.

Figure 11B:
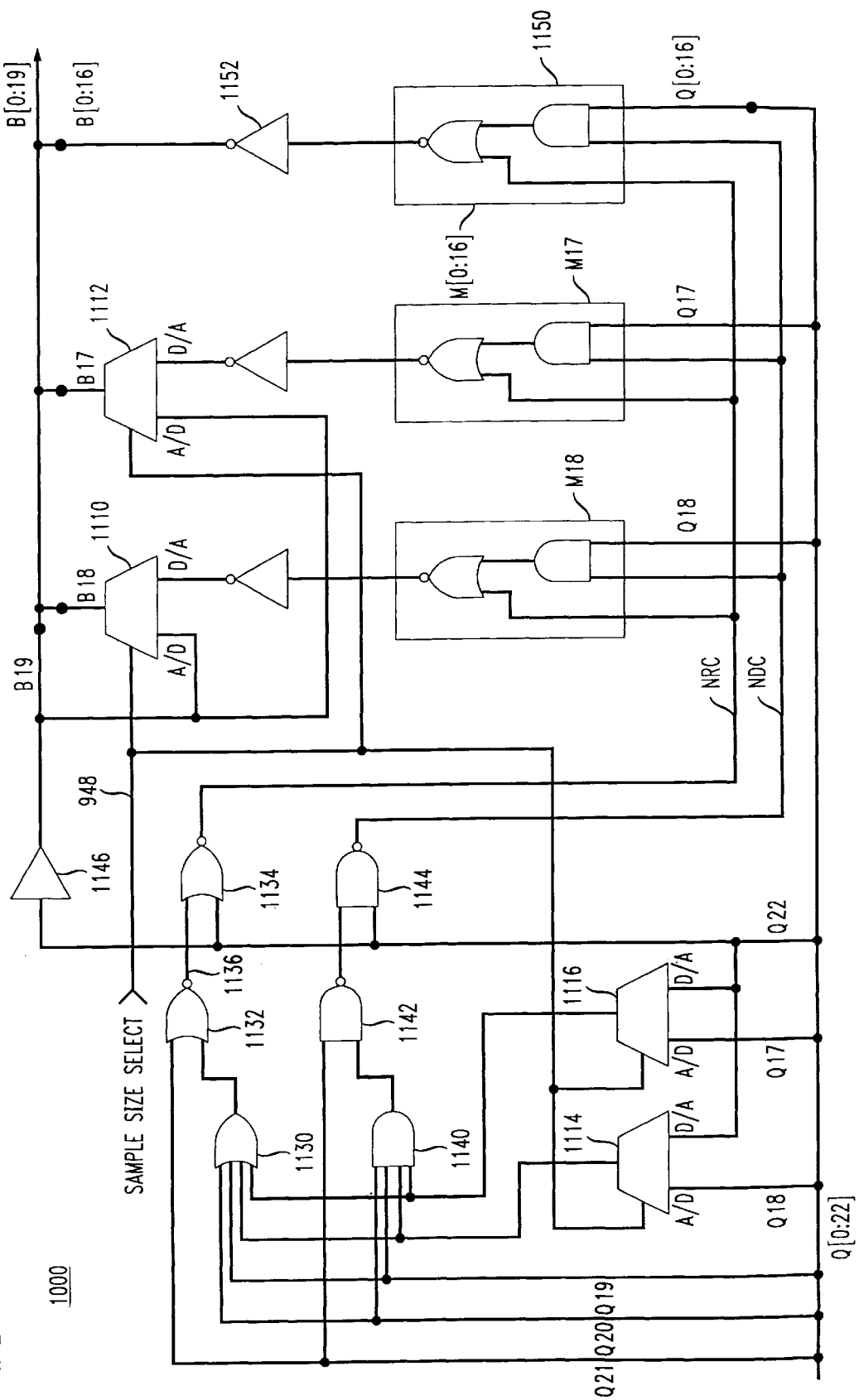
FIG. 11B shows in more detail an embodiment of the overflow/clamp circuit shown in FIGS. 10A and 10B.

FIG. 11B shows an example circuit for implementing the combined overflow check module 1010 and combined clamping module 1020 in the present embodiment, e.g., for clamping input data samples to 18- and 20-bit data samples. Remembering that the typical separate overflow/clamp circuits 950 and 952 and MUX 914 as shown in FIG. 9 required, e.g., twenty parallel lines being multiplexed in MUX 914, the inventive technique eliminates the need for the twenty parallel MUXs 914 at the output of the overflow/clamp circuit.

In the inventive technique, fewer MUXs are required corresponding to two times the difference in the lengths of the data samples being overflow checked and clamped, e.g., 20-bits minus 18-bits equals 2-bits, times 2=4 MUXs required in accordance with the principles of the embodiment. The positions of these four MUXs 1110–1116 are determined by the sample size select signal 948. If the sample being processed is a small data sample (e.g., an 18-bit sample), then the MUXs 1110–1116 allow the appropriate bit of the shorter data samples (e.g., those labeled "A/D" in FIG. 11B) to pass through. If the sample is a large data sample (e.g., a 20-bit sample), then the MUXs 1110–1116 allow the appropriate bit of the larger data samples (e.g., those labeled "D/A" in FIG. 11B) to pass through.

The overflow/clamp circuit 1000 implements a first data sample length overflow check and clamping, e.g., 18-bits overflow check and clamping, if processing an 18-bit sample, and implements a second data sample length overflow check and clamping, e.g., to 20-bits if processing a 20-bit sample, as determined by a sample size select signal 948. The sample size select signal 948 indicates current processing of a shorter data sample, e.g., in the A/D direction when at a first logic level (e.g., logic "1") or of a longer data sample, e.g., in the D/A direction when at a second logic level (e.g., logic "0"). A multi-bit sample size select signal 948 could be implemented to allow greater flexibility in the number of input sample sizes.

In FIG. 11B, input signals Q0 to Q22 correspond to input sample bits, Q0 corresponding to the least significant bit (LSB) and Q22 corresponding to a most significant bit (MSB) or sign bit. Output signals B0 to B19 correspond to 20-bit output samples, B0 corresponding to the LSB of the output sample and B19 corresponding to the MSB or sign bit. Output signals B0 to B17 correspond to the 18-bit output data samples B0 corresponding to the LSB and B17 corresponding to the MSB or sign bit.

The elements 1130, 1132, 1134 in FIG. 11B implement the logic shown in FIG. 11A(1) to test for a positive overflow condition, and elements 1140, 1142 and 1144 in FIG. 11B implement the logic shown in FIG. 11A(2) to test for a negative overflow condition. The seventeen lowest input data bits, i.e. Q0 to Q16, are output through elements 1150 as output data bits B0 to B16, respectively for non-overflow conditions of all samples because these bits are in common and do not constitute a MSB or sign bit. The non-overlapping data bits, i.e. the $18^{th}$ and $19^{th}$ data bits in the disclosed example, are passed through MUXs 1110, 1112 if (a) the longer data sample is being tested for overflow as indicated by the sample size select signal 948; and (b) there is no overflow detected.

The MSB or sign bit of the input data sample Q23 (which is 23 bits wide to include all possible overflow information due, e.g., to gain stages) is moved to be the MSB or sign bit in the output data sample B19 or B17. In the disclosed embodiment of FIG. 11B, the $23^{rd}$ input data bit Q22 is output through buffer 1146 as the $20^{th}$ output data bit B19 in the D/A, 20-bit direction, and through MUX 1112 as the $18^{th}$ output data bit B17 and as the $19^{th}$ output data bit B18, in the A/D, 18-bit direction.

An overflow condition is detected by respective logic levels of signals NRC and NDC being at a same logic level, i.e., they are both "0" or are both "1". FIGS. 12A and 12B show the logical function of the circuit of FIG. 11B for short data samples, e.g. 18-bit samples, and for long data samples, e.g., 20-bit samples, respectively. If both the NRC and NDC signals are at a logic "1", then a positive overflow condition has been detected, and if both the NRC and NDC signals are at a logic "0", then a negative overflow condition has been detected. The overflow checked and clamped output data samples, e.g., B0 to B17 or B0 to B19 output from the circuit shown in FIG. 11B, are right justified, with the clamped-off bits to the left filled with a sign bit (sign extension).

Figure 13:
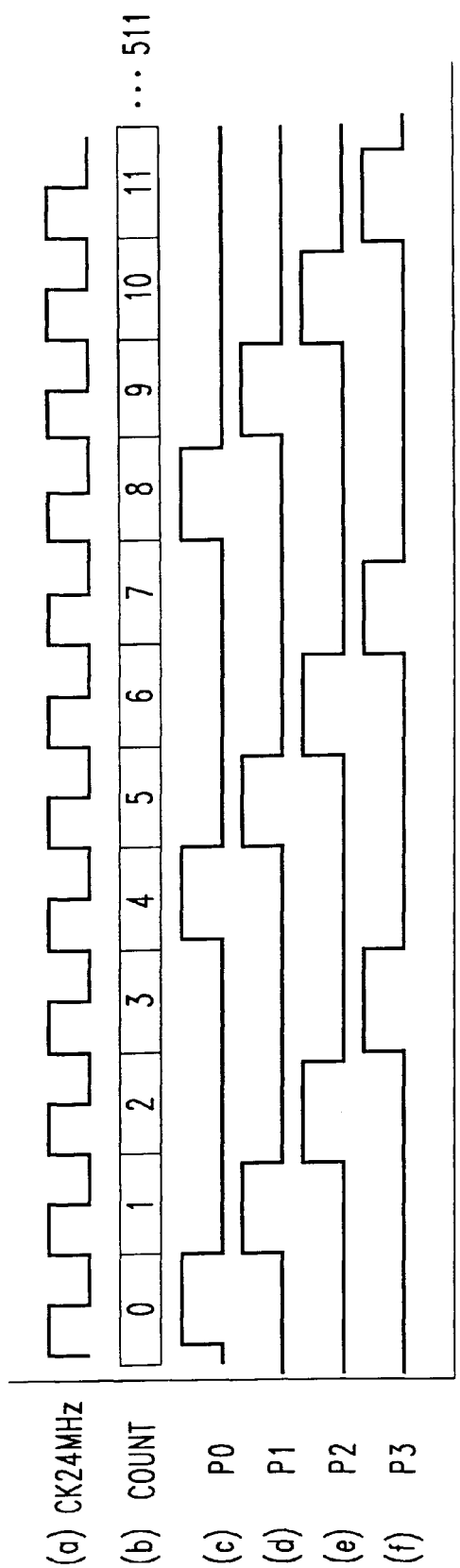
FIG. 13 is a timing diagram showing four cycles of a clock for use in each stage of an Infinite Impulse Response (IIR) filter in an embodiment of the present invention
Figure 14A:
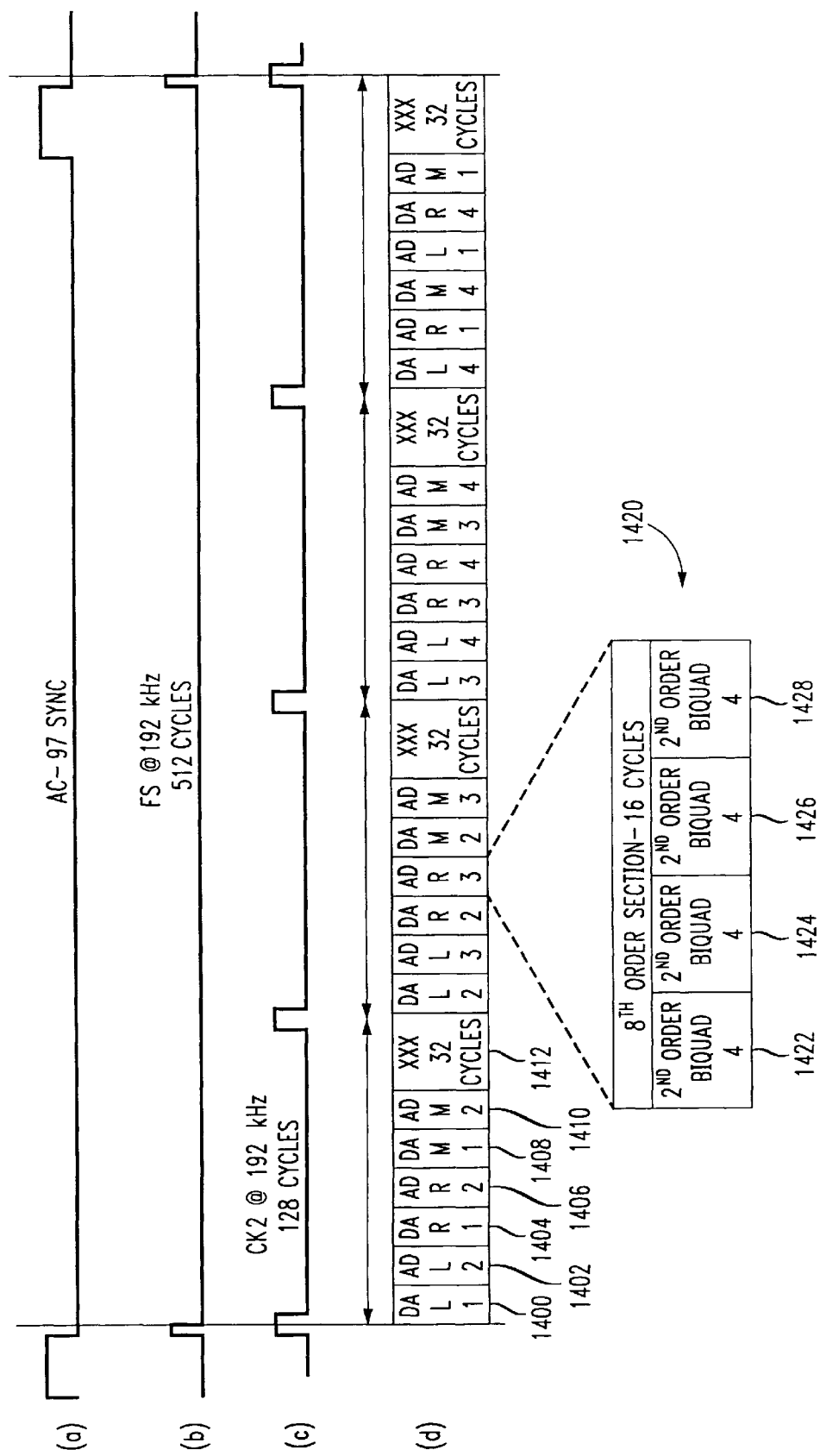
FIGS 14A, 14B and 14C are more detailed diagrams showing the implementation of six channels of 4 stage (i.e., $8^{th}$ order) IIR filters in the embodiment of the present invention.
Figure 14B:
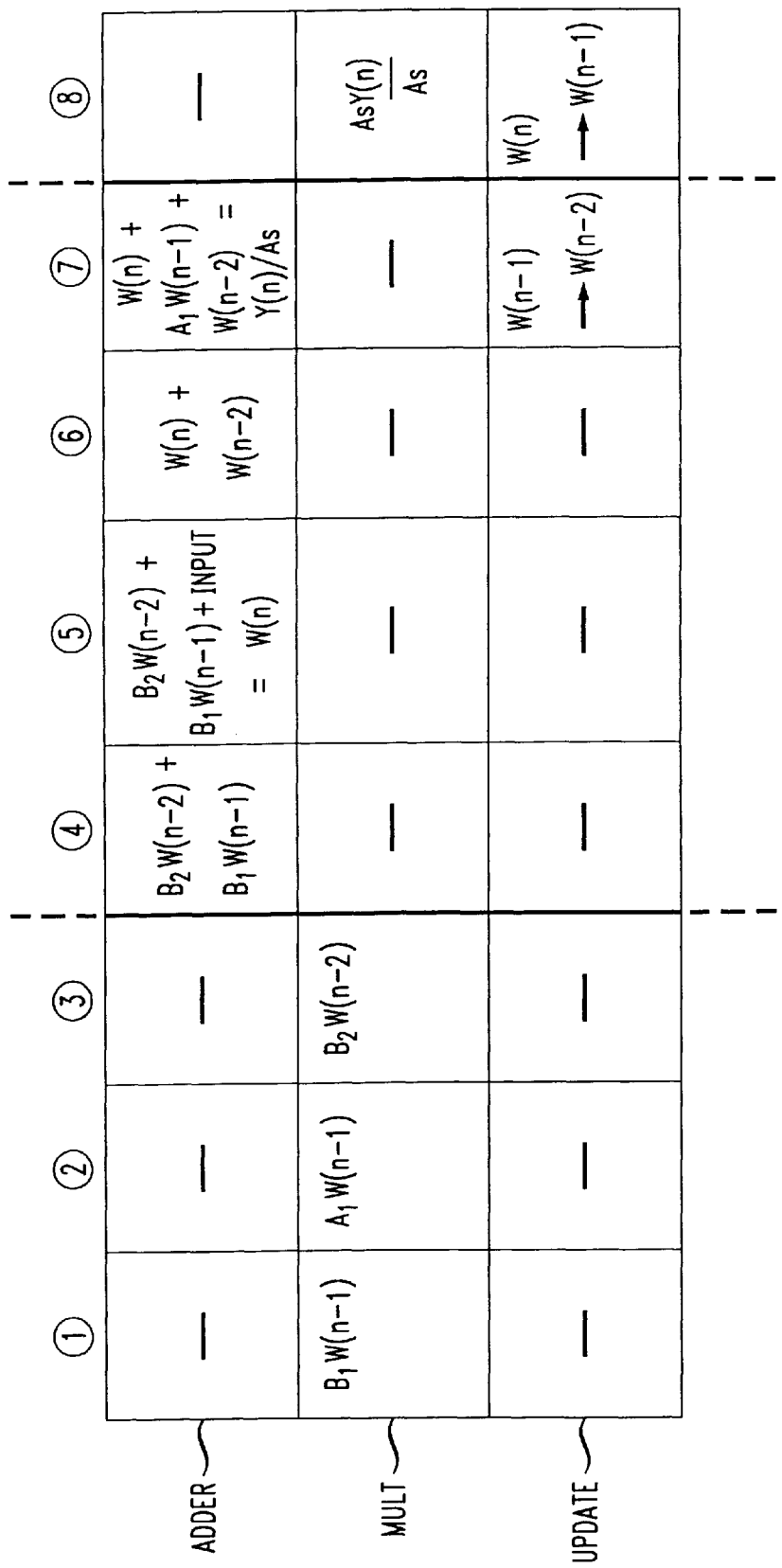
Figure 14C:
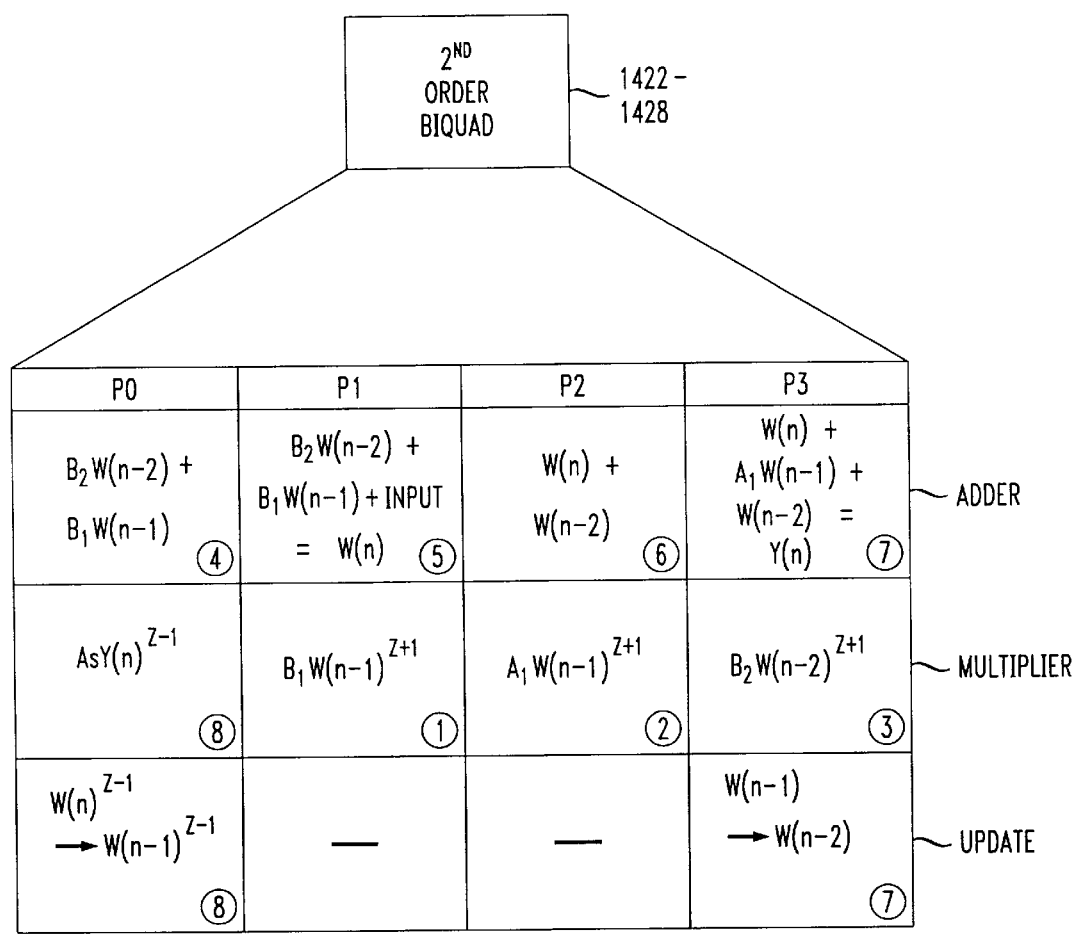
Figure 15:
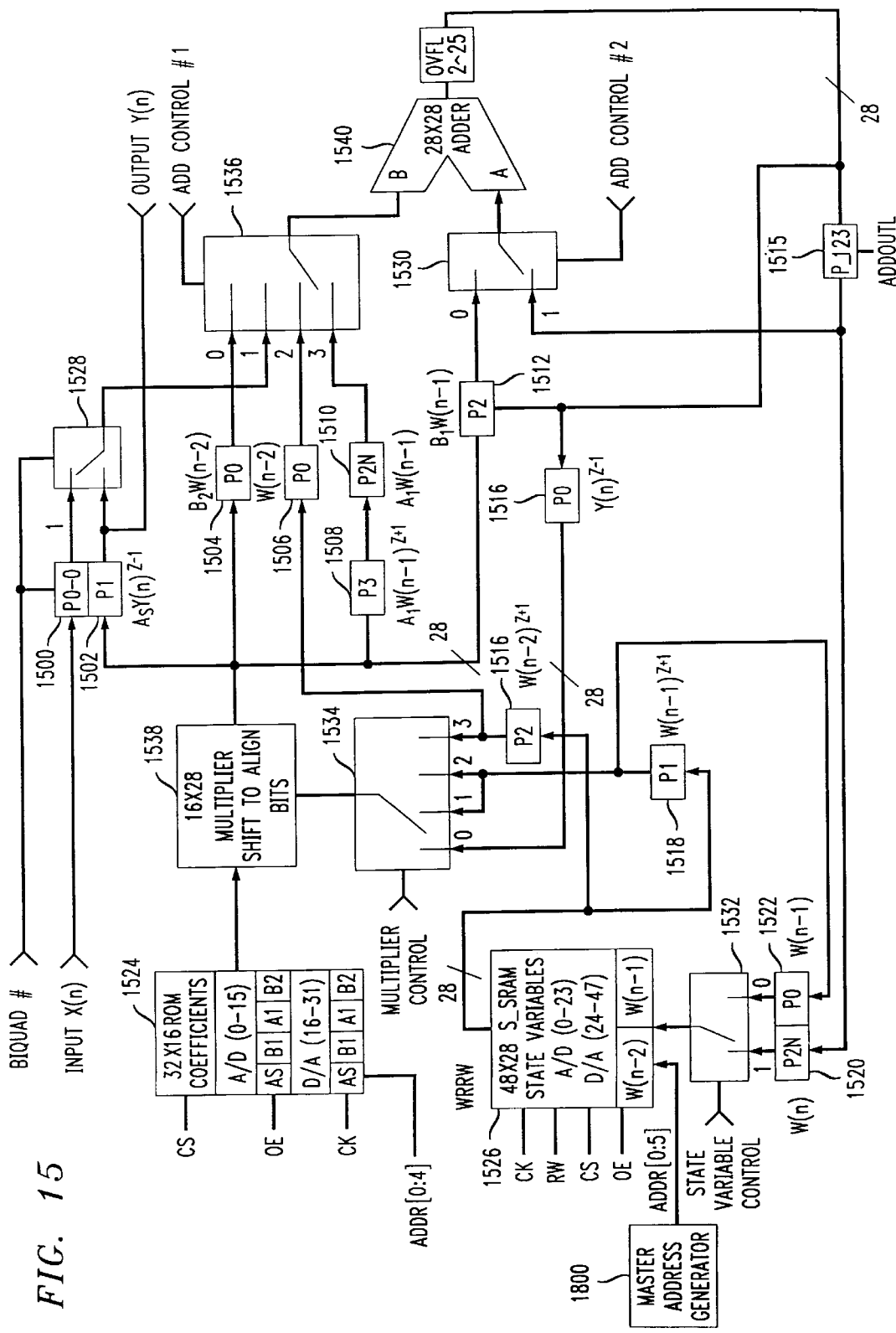
FIG. 15 is a schematic block diagram showing a six channel, $8^{th}$ order IIR filter in accordance With the embodiment of the present invention.

FIGS. 13–15 describe the IIR filter 508 (FIG. 5B) in more detail.

In particular, IIR filter 508 either interpolates or decimates data samples, at input or output to the IIR filter 508. For instance, in the disclosed embodiment, the IIR filter 508 decimates by 4 by ignoring 3 of every 4 IIR outputs, or interpolates by 4 by repeating an input 4 times, e.g., by sampling and holding.

In the disclosed embodiment, D/A direction data samples are interpolated by 4 from 48 Kb/s to 192 Kb/s, and A/D direction data samples are decimated from 192 Kb/s to 48 Kb/s.

The IIR filter 508 in the disclosed embodiment is comprised of four stages. However, there is no direct relationship between the number of stages and the interpolation/decimation rate.

Generally, an IIR filter may be performed either as a software process or in hardware. While software is often conventionally preferred because of the usual flexibility, the IIR filter 508 of the present invention inventively implements the stages of the IIR filter 508 primarily in hardware in such a way that not only is the hardware implementation much faster than an equally clocked processor implementation, but future expansion of devices utilizing the IIR filter 508 to increase the number of IIR filter channels is simplified greatly.

Each stage of the IIR filter 508 calculating the solution to an equation having a quadratic equation in both the numerator and denominator, otherwise known as a $2^{nd}$ order biquadratic equation, or $2^{nd}$ order biquad, performs the following transfer function:

$$H(z) = \frac{A_0 + A_1 z^{-1} + A_2 z^{-2}}{1 - B_1 z^{-1} - B_2 z^{-2}} \qquad \text{Eq. (1)}$$

In order to calculate the biquad in the time domain, the following difference equations are used:

$$W(n)=X(n)+B_1 W(n-1)+B_2 W(n-2) \qquad \text{Eq. (2)}$$

$$Y(n)=(W(n)+A_1 W(n-1)+A_2 W(n-2))\times A_S \qquad \text{Eq. (3)}$$

wherein W(n) is the state variable, X(n) is the input, and Y(n) is the output.

The terms "n−1" and "n−2" refer to a digital delay term, i.e., e result for that $2^{nd}$ order biquad from the previous, and the second previous data frames, respectively. $A_1$, $A_2$, $A_S$, $B_1$ and $B_2$ are constant coefficients which are unique for each $2^{nd}$ order biquad and determined in conventional ways. The coefficient $A_S$ is a scaling factor used to bring the output Y(n) to unity gain. The calculations for the state variable W(n) and output Y(n) equations may be simplified by setting $A_0$ and $A_2$ equal to 1. Thus, the equations become:

$$W(n)=X(n)+B_1 W(n-1)+B_2 W(n-2) \qquad \text{Eq. (4)}$$

$$Y(n)=[W(n)+A_1 W(n-1)+W(n-2)]\times A_S \qquad \text{Eq. (5)}$$

The present embodiment implements the solution to these equations in hardware components such that each stage of the IIR filter is performed in a mere four clock cycles. The clock speed may be any rate suitable to the speed of the components used. Thus, as a device progresses through development, additional stages can be added to the IIR filter 508, or additional channels of IIR filtering may be added to the device, merely by speeding up the clock.

In particular, FIG. 13 shows a general timing diagram of each stage of a hardware implementation of the IIR filter 508 utilizing four cycles of a clock to perform each $2^{nd}$ order biquad section of the IIR filter 508. The calculations of the IIR filter 508 are controlled by four clock pulses P0, P1, P2 and P3. These clock pulses P0–P3 repeat every four clock cycles independent of the size of the IIR filter 508 in each channel. Thus, with every four cycles of a clock, particularly on every pulse P1, a new $2^{nd}$ order biquad output is produced.

Typically, IIR filtering is performed on data which is refreshed in subsequent frames of a data signal. Because of the impending subsequent frame of data, real time processing on the current data sample must be completed before it is refreshed. This generally results in a limit to the amount of real time data processing which can be performed on framed data. In the disclosed embodiment of an AC '97 audio codec, the framing signal of the AC link refreshes data in each data frame at a rate of 48 KHz. While the particular speed of the framing signal may change over time, the basic premise is that real time data processing should be completed on each data sample within one 48 KHz frame. Within the limits of a number of clock cycles which may occur within each frame of data, additional processing requirements are handled by the addition of parallel IIR filters handling separate data channels.

A 24 MHz system clock signal in the disclosed embodiment is shown in waveform (a) of FIG. 13. Up to 512 24 MHz clock cycles will occur within each frame, as shown in waveform (b) of FIG. 13. Four clock pulses P0–P3 (waveforms (c) to (f) in FIG. 13, respectively) may be generated from the overall system clock signal, e.g., the 24 MHz signal shown in waveform (a) of FIG. 13, for use by each stage of the inventive IIR filter 508.

The individual stages or $2^{nd}$ order biquads may be assembled in various ways to accomplish either fewer channels with higher interpolation and decimation and less out-of-band rejection, or a greater number of channels with lower interpolation and decimation and higher out-of-band rejection, given a fixed number of four-clock-cycles within a frame of data. The present embodiment implements six channels of IIR filtering, each channel including four stages or $2^{nd}$ order biquads, within each frame of data, with excess processing time to spare.

In particular, FIG. 14A is a timing diagram showing the ordering and performance of six channels of $8^{th}$ order IIR filtering within each frame of data in an audio codec, e.g., in conformance with the AC '97 specification. The $8^{th}$ order IIR filters are each formed from four sequential $2^{nd}$ order biquad sections.

In FIG. 14A, a synchronizing signal (waveform (a)) such as that present in accordance with the AC '97 specification is the basis for generating a frame signal shown in waveform (b). A 192 KHz signal shown in waveform (c) is synchronized with the frame signal or synchronizing signal such that four cycles of the 192 KHz clock occur during each frame of data. The 192 KHz and 48 KHz synchronizing signal correspond to the desired input and output data rates of the IIR filter 508, and to an interpolation and decimation of 4.

The present invention is equally applicable to other data rates, both input and output from the IIR filter 508, as well as the amount of interpolation and/or decimation performed. The particular data rates and partitioning of $2^{nd}$ order biquad stages of the IIR filters are shown for exemplary purposes only with respect to the present embodiment in an audio codec conforming in general to the AC '97 specification.

Waveform (d) of FIG. 14A shows individual time slots 1400–1410 each corresponding to the processing of an $8^{th}$ order IIR filter for a particular channel of data. For instance, in the disclosed embodiment the $8^{th}$ order IIR filter 1400 corresponds to the IIR filtering in the digital filter/adjust module 450 shown in FIG. 4, $8^{th}$ order IIR filter 1402 corresponds to the IIR filtering in the digital filter/adjust module 434, $8^{th}$ order IIR filter 1404 to digital filter/adjust module 452, $8^{th}$ order IIR filter 1406 to digital filter/adjust module 436, $8^{th}$ order IIR filter 1408 to digital filter/adjust module 454, and $8^{th}$ order IIR filter 1410 to digital filter/adjust module 428. The present embodiment has excess IIR filtering capacity in the disclosed embodiment as demonstrated by the excess 32 clock cycles 1412 at the end of each 192 KHz block, during which time the digital filtering may be powered down.

Each $8^{th}$ order IIR filter 1400–1410 comprises four separate $2^{nd}$ order biquads, as shown in blowup diagram 1420, and thus requires 16 cycles of the clock to perform in accordance with the principles of the present invention. Each $8^{th}$ order IIR filter 1400–1410 comprises four $2^{nd}$ order biquads 1422–1428 requiring four clock cycles a piece. Thus, the disclosed embodiment of the IIR filter 508 performs six channels of $8^{th}$ order IIR filtering (with 8 $2^{nd}$ order biquads to spare in the excess modules 1412) within each 192 KHz block interpolating and decimating between the 192 KHz block and the 48 KHz frame.

FIG. 14B is a conceptual diagram for showing the calculation of Eqs. (4) and (5), while FIG. 14C shows the embodiment of the present invention which calculates the output Y(n) in four clock pulses P0–P3 in accordance with the present embodiment of the invention.

FIG. 14B shows eight individual steps or calculations 1–8 which lead to the solution of Eq. (5). Note that an adder is used in steps 4–7, a multiplier is used in steps 1–3 and 8, and state variables are swapped or updated in steps 7 and 8.

In step 1, the coefficient $B_1$ for the current $2^{nd}$ order biquad is retrieved from memory and multiplied by the state variable W(n–1) from the previous data frame (which the first time through at startup will be zero, but otherwise will have been calculated before completion of the previous data frame).

In step 2, the coefficient $A_1$ for the current $2^{nd}$ order biquad is retrieved from memory and multiplied by the same state variable W(n–1) from the previous data frame.

In step 3, the coefficient $B_2$ is retrieved from memory and multiplied by the result of the state variable W(n–2) from the data frame two frames previous (which the first two times after startup will be zero).

In step 4, the result of steps 1 and 3 are added together using an adder.

In step 5, the result of step 4 is added to the input X(n) to yield the state variable W(n) for the present data frame.

In step 6, the state variable W(n) for the current $2^{nd}$ order biquad is added to the state variable W(n–2) from two frames previous, for the current $2^{nd}$ order biquad.

In step 7, the result of step 6 is added to the result of step 2 to result in the output Y(n) before multiplication by the scaling factor $A_S$. Then, in step 8, the result of step 7 is multiplied by the scaling factor $A_S$ to result in the output for the current $2^{nd}$ order biquad. Also, in step 7, the state variable W(n–2) for the data frame two frames previous is reset with the value of the previous state variable W(n–1) for the current $2^{nd}$ order biquad.

In step 8, the state variable W(n–1) for the previous data frame is updated with the current state variable W(n).

Note that the update in step 7 could not occur until after the state variable W(n–2) for two frames previous is last used, i.e., in step 6. Note also that this update cannot occur until after the state variable W(n–1) for the previous data frame is used to update the state variable W(n–2) from two frames previous in step 7. Thus, but for the inventive general ordering of the processing of the mathematical operations into as few as four cycles in accordance with the principles of the present invention, it would appear that a finite amount of clock cycles would be required to operate a single adder and a single multiplier to perform a $2^{nd}$ order biquad function of an IIR filter.

To increase the number of $2^{nd}$ order biquad filters in the IIR filter for any given clock speed, it is necessary and desirable to minimize the clock cycles required for the calculation of the output Y(n) of each $2^{nd}$ order biquad. A first possible reduction can be seen in step 2, which can be performed by the multiplier in any clock cycle before step 7, where the result is first used. Thus, step 2 can be eliminated by performing the multiplication of $A_1$W(n–1) in, e.g., step 4. FIG. 14B shows that four additions and four multiplications are required for the calculation of the output of each $2^{nd}$ order biquad. Thus, in theory, the minimum number of clock cycles for a single adder and a single multiplier to calculate the output Y(n) in accordance with the principles of the present invention is four clock cycles. The present embodiment of the invention advantageously calculates the output Y(n) in the theoretical minimum number of clock cycles, i.e., four.

FIG. 14C is a blown up diagram showing the calculations performed by the adder, multiplier and update portions of the IIR filter during each of the four clock pulses P0–P3 for each $2^{nd}$ order biquad 1422–1428 shown in FIG. 14A.

In particular, steps 4–7 shown in FIG. 14B are the basis for the four clock pulses P0–P3, respectively. The remaining operations of the multiplier and update portion shown in steps 1–3 and 8 of FIG. 14B are consolidated into steps 4–7 of earlier and later calculations for other $2^{nd}$ order biquads.

In particular, the multiplication operations $B_1$W(n–1), $A_1$W(n–1), and $B_2$W(n–2) (steps 1–3 of FIG. 14B) are performed respectively in the second, third and fourth P1–P3 clock pulses of the calculations for the previous $2^{nd}$ order biquad, and the multiplication of the scaling factor $A_S$ by the result of the addition (step 7 of FIG. 14B) is performed in the first clock pulse P0 of the next frame for the $2^{nd}$ order biquad. Similarly, the update which occurred in step 8 of FIG. 14B is performed during the first clock pulse P0 of the next data frame for the $2^{nd}$ order biquad.

Note that the general ordering of operations is important because of the use of the result of earlier operations in subsequent operations. Thus, by calculating the operations $B_1W(n-1)$, $A_1W(n-1)$, and $B_2W(n-2)$ during the four clock pulses for the previous $2^{nd}$ order biquad, the results are available for use in the first clock pulse P0 of the four clock pulses for the current $2^{nd}$ order biquad. Similarly, the multiplication of the scaling factor $A_S$ by the final addition performed during clock pulse P3 is not performed until after clock pulse P3. Therefore, the output Y(n) for a particular $2^{nd}$ order biquad in a particular data frame is not actually available until after the first clock pulse P0 of the next $2^{nd}$ order biquad.

A particular advantage of having the $2^{nd}$ order biquads requiring only four (as opposed to, e.g., five six or seven) clock pulses each, as an average, is that the four cycle count is easily obtained in hardware by utilizing only the lowest two bits of a system clock. If the clock count were, e.g., five, additional counter bits would necessarily have to be decoded to determine the intervals, e.g., five, ten, fifteen, twenty, etc.

FIG. 15 is a particular embodiment of the four cycle $2^{nd}$ order biquad in accordance with the principles of the present invention.

In FIG. 15, the $2^{nd}$ order biquad includes a coefficient read only memory (ROM) 1524, a state variable random access memory (RAM) 1526, a multiplier 1538, and an adder 1540.

The coefficient read only memory (ROM) 1524 stores the $A_S$, $B_1$, $A_1$ and $B_2$ coefficients for each of the four $2^{nd}$ order biquads of each IIR filter for use in a decimating (i.e., A/D) direction, and the $A_S$ $B_1$, $A_1$, and $B_2$ coefficients for each of the four $2^{nd}$ order biquads of each IIR filter for use in an interpolating (i.e., D/A) direction. Thus, in the disclosed embodiment, coefficient ROM 1524 stores 32 constant coefficients which are determined for the particular transfer function of the IIR filter.

The state variable random access memory (RAM) 1526 temporarily stores the state variables W(n-1) for the previous data frame and the state variables W(n-2) for the data frame two frames previous, for each of the four $2^{nd}$ order biquads, for each of the three channels of the IIR filter, in both the decimating (i.e., A/D) direction, and the interpolating (i.e., D/A) direction. Thus, the state variable RAM 1526 temporarily stores a total of 48 state variables, which are each updated during each data frame. The coefficient ROM 1524, the state variable RAM 1526, and the IIR filter in general are clocked together, e.g., at 24.576 MHz in the disclosed embodiment shown in FIG. 15.

Various latching functions 1500–1522 are implemented to latch data during particular clock pulses P0–P3 as indicated. Moreover, in addition to the various latches 1500–1522, various switching functions (e.g., multiplexers) 1528–1536 switch various input to a subsequent processing device.

The multiplier 1538 multiplies appropriate coefficients obtained from the coefficient ROM 1524 by variables output by a switching function 1534. Coefficients from the coefficient ROM 1524 are presented to one side of the multiplier 1538 under the control of, e.g., five address lines ADDR [0:4], and the other side of the multiplier 1538 is switched from among four sources selected by switch 1534. The first source for the multiplier 1538 for use during the first clock pulse P0 is the output of latch 1514 which contains the output of the adder 1540 from the previous cycle, i.e., the unscaled output Y(n) from the previous $2^{nd}$ order biquad. The second and third sources for use during the second and third clock pulses P1 and P2 are the same, i.e., the state variable W(n-1) from the previous data frame, latched in the latch 1518. The fourth source for use by the multiplier 1538 during the fourth clock pulse P3 is the state variable W(n-2) from the data frame two frames previous, latched in latch 1516. These four sources into switch 1534 are multiplied with the respective coefficients for the particular $2^{nd}$ order biquad from the coefficient ROM 1524 during the first through fourth clock pulses P0–P3, respectively, to implement the multiplication functions $A_SY(n)$, $B_1W(n-1)$, $A_1W(n-1)$ and $B_2W(n-2)$, shown in FIG. 14C.

The notation "Z-1" in FIG. 15 refers to a pipelined calculation performed during the four clock pulses of the previous $2^{nd}$ order biquad of the filter channel, and the notation "Z+1" refers to a prefetch operation wherein calculations are performed during the four clock pulses of the current $2^{nd}$ order biquad for the subsequent $2^{nd}$ order biquad.

Switch 1528 outputs either a latched input data sample (e.g., for the first $2^{nd}$ order biquads in each filter channel) or an output from an intermediate $2^{nd}$ order biquad calculation (e.g., from the first, second and third $2^{nd}$ order biquads in each filter channel). Thus, in the disclosed embodiment, switch 1528 outputs a previous output from the previous $2_{nd}$ order biquad calculation in three out of four $2^{nd}$ order biquads. After the calculation of the fourth biquad, the output signal Y(n) is present at the output of latch 1502.

The adder 1540 adds a first parameter input from switch or multiplexer 1536 to a second parameter input from switch or multiplexer 1530. The first source for the adder for use during the first clock pulse P0 is the output of latch 1504, which contains $B_2W(n-2)$ calculated during the previous $2^{nd}$ order biquad, and the second source or parameter to be added to the first source is $B_1W(n-1)$ which was also calculated during the previous $2^{nd}$ order biquad, is contained in the latch 1512. The output of the adder 1540 is latched in latch 1515 and looped back around to the second input of the adder 1540 for each of the second third and fourth clock pulses P1–P3. Thus, during the second clock pulse P1, the adder 1540 adds the second source of switch 1536, i.e. the input X(n) latched in latch 1500, to the previously added sum of $B_2W(n-2)+B_1W(n-1)$ to obtain the state variable W(n) for the current data frame. During the third clock pulse P2, the adder adds the third source to switch 1536, i.e., the state variable W(n-2) from the data frame two frames previous stored in latch 1506 to the state variable W(n) for the current data frame stored in latch 1515 to obtain W(n)+W(n-2). Finally, during the fourth clock pulse P3, the adder 1540 adds the fourth input to switch 1536, i.e., the parameter A1W(n-1), calculated during the previous $2^{nd}$ order biquad, to the previously added sum to obtain the unscaled output Y(n).

In the state variable RAM 1526, during the first clock pulse P0, the state variable W(n-1) for the previous data frame is replaced by the state variable W(n) for the current data frame, for the previous $2_{nd}$ order biquad. Also, during the fourth clock pulse P3, the state variable W(n-2) calculated two data frames previously is replaced with the state variable W(n-1) calculated in the previous data frame.

A method of resetting the state variables of the IIR filter stored in the RAM 1526 shown in FIG. 15 will now be described with respect to FIGS. 16 and 17.

In general, a frame sync signal is used to control the timing of data samples into the IIR filter. The frame sync signal is also used to reset control signals to the various switches, clock pulse generator and other functions of the IIR filter at the beginning of every data frame.

All variables, (e.g., 48 variables in the disclosed embodiment) in the state variable RAM 1526 are read and updated during each data frame. However, if the state variables are not reset, i.e., if the state variable RAM 1526 is not reset with zeroes or other appropriate nominal value in each of the utilized memory locations in the state variable RAM 1526, erroneous data samples will be output at least for two data frames from the IIR filter, which may greatly affect further data processing outside of the IIR filter (e.g., an FIR filter).

One technique of resetting a state variable RAM 1526 is to multiplex a zero value into the data port of the state variable RAM 1526 as the state variable RAM 1526 is subjected to write cycles through all pertinent addresses. This technique is shown in FIG. 16.

In particular, in normal operation, the state variable RAM 1526 receives chip select CS, output enable OE, write enable WE and address bus ADDR information as appropriate from normal RAM logic 1602 to write data to proper locations and to output data from the proper locations as desired by the $2^{nd}$ order biquad. The data input to the state variable RAM 1526 is latched by latch 1612, and the data output from the state variable RAM 1526 is latched by latch 1614. However, the state variable RAM 1526 is not controlled by a processor which can easily clear all pertinent locations of the state variable RAM 1526. Instead, the zeroing function in the state variable RAM 1526 is performed in hardware. Thus, multiplexers (MUXs) 1608 and 1610 are used to switch between a normal addressing control from the normal RAM logic 1602 to initialize RAM logic 1604 which cycles through all pertinent locations in the state variable RAM 1526 during an initializing sequence. Similarly, instead of normal data being applied through the latch 1612 to the input of the state variable RAM 1526, zeroes are applied to the input of the state variable RAM 1526 through MUX 1610 and latch 1612.

Input and output data latches 1612 and 1614 are reset only by a general reset signal, which is activated either at startup or to recover from a debilitating event.

MUXs 1608 and 1610 are controlled together based on the determination of a first frame in first frame detector 1606 to allow either the normal RAM logic 1602 to control the operations of the state variable RAM 1526 while normal data input is applied to the data input of the state variable RAM 1526, or the initialize RAM logic 1604 to control the operations of the state variable RAM 1526 while zeroes are applied to the data input.

Figure 16:
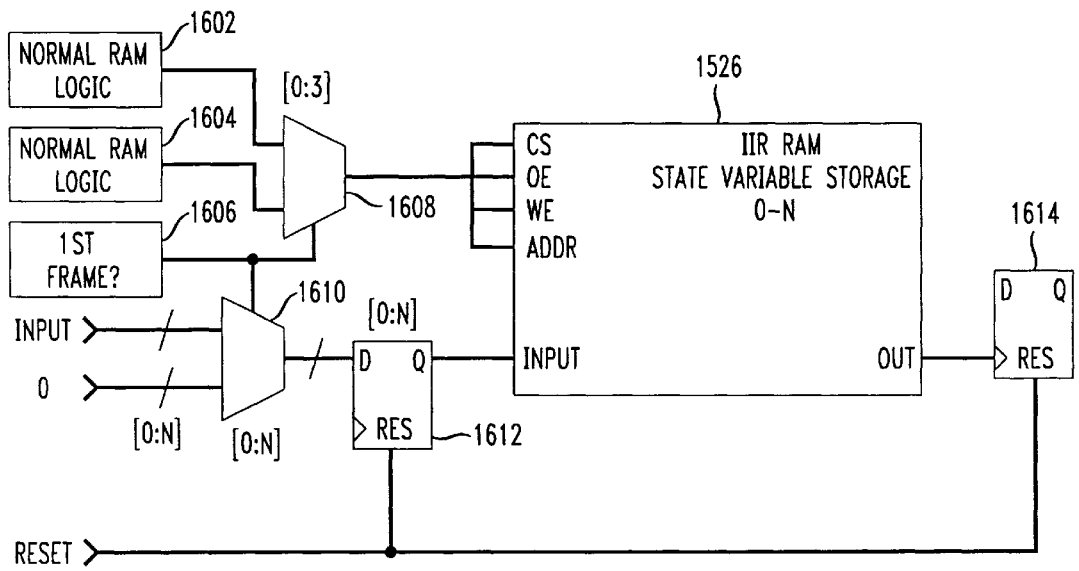
FIG. 16 shows one technique for initializing random access memory (RAM) for storing state variables for a digital IIR filter.

While the circuit shown in FIG. 16 will perform the desired function, the added multiplexers may cause additional delay in the address and data paths, which might be disadvantageous in a normal operating condition where speed is at a premium.

Figure 17:
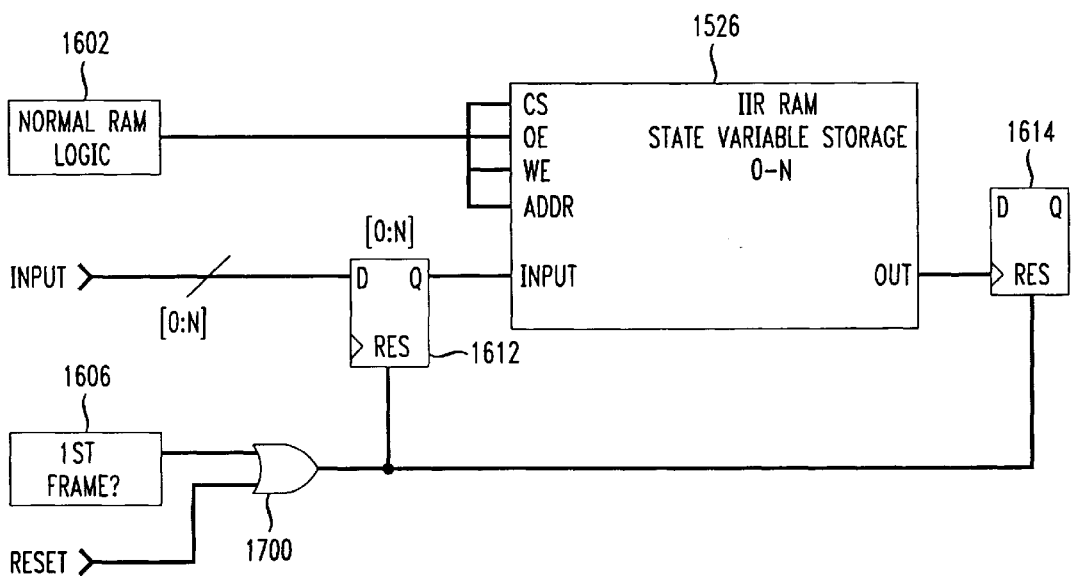
FIG. 17 shows an improved technique for initializing random access memory for storing variables for a digital IIR filter in accordance with another aspect of the present invention.

A more preferable technique for resetting the state variables stored in state variable RAM 1526, particularly in time sensitive applications, is shown in FIG. 17. In FIG. 17, the otherwise required multiplexers 1608, 1610 and initialize RAM logic 1604 shown in FIG. 16 are eliminated to prevent the additional delay inherent in passing signals through a multiplexing device.

In particular, the normal RAM logic 1602 is input directly to the appropriate control inputs of the state variable RAM 1526, without passing through a MUX 1608 as shown in FIG. 16. Moreover, the normal data is input directly to the latch 1612 for the data bus of the state variable RAM 1526 rather than passing through a MUX 1610 as shown in FIG. 16.

Inventively, instead of resetting the input and output data latches 1612 and 1614 with only the general reset signal, additional logic 1700 is added to allow the input and/or data latches 1612 and 1614 to also be reset on a more frequent, normal operation type basis.

In particular, an OR gate 1700 allows either the general reset signal to cause the input and output data latches of the state variable RAM 1526 to reset, or an additional reset signal determined based on a frame signal, e.g., by the first frame detector 1606.

The circuit shown in FIG. 17 takes advantage of the fact that every pertinent location in the state variable RAM 1526 is written to once during each frame. Thus, in operation, the input latch 1612 is held in a reset condition such that it outputs a zero for the duration of the reset condition. The output of the first frame detector is active for the entire duration of a detected first frame, and thus directs the input latch 1612 to input a zero into each pertinent location of the state variable RAM 1526 as each pertinent location of the RAM is otherwise accessed by the normal RAM logic 1602.

Holding the output latch 1614 in reset for the entire first data frame prevents old state variable information from being introduced into the calculations of the IIR filter, and thus allows the IIR filter to start fresh when reset. However, if the influence of old state variable information is desired even in a reset condition, the state variable RAM 1526 will be reset by resetting only the input latch 1612.

The preferred technique of resetting the state variables in the state variable RAM 1526 eliminates additional delays otherwise introduced by MUXs 1608, 1610 shown in FIG. 16.

The four-cycle $2^{nd}$ order biquads in accordance with the present aspect of the invention improve greatly upon previous implementations, e.g., those in software in a DSP, by streamlining and simplifying the filtering process.

The master address generator 1800, which controls addressing to the state variable RAM 1526, will now be described in greater detail, with reference to FIGS. 18A(1), 18A(2), 18B(1) and 18B(2).

For software implementations of an IIR filter, the particular ordering of the state variables in memory may not be particularly important. However. in hardware implementations of an IIR filter as in the embodiments shown in FIGS. 18A(1) and 18A(2), the addressing of the state variables in the state variable RAM 1526 for use in the multiplication and addition functions of each $2^{nd}$ order biquad in the IIR filter should be coordinated with the calculations being performed for each $2^{nd}$ order biquad.

The disclosed master address generator 1800 is independent of the specific number of $2^{nd}$ order biquad filters used, i.e., the filter order or the number of IIR filter channels implemented. While described with respect to a specific application including three decimating $8^{th}$ order IIR filter channels and three interpolating $8_{th}$ order IIR filter channels, the principles relate to any number of hardware implemented decimating and/or interpolating channels of digital IIR filters of any order.

The state variable RAM 1526 of the disclosed embodiment stores 48 state variables, each up to 28 bits wide, two for each $2^{nd}$ order biquad implemented in each direction. For ease of hardware design, the sequence of the access to each of these 48 variables is controlled by the address output from the master address generator 1800. The output addresses are generated on a falling edge of a clock signal, e.g., the 24.576 MHz clock, and latched on the rising edge of the clock signal.

Two locations in the state variable RAM 1526 are required for each $2^{nd}$ order biquad filter implemented. Thus, as the order of the IIR filter and/or the number of filtered channels increases, the number of required locations in the state variable RAM 1526 increases. Conventional software or hardware implementations require reprogramming or rewiring of the addressing to a state variable RAM depending upon the number of $2^{nd}$ order biquads implemented. The present invention eliminates significant reprogramming and/or rewiring by providing a design which is independent upon the number of channels implemented. Thus, as requirements increase, e.g., for greater signal-to-noise ratio output, for additional audio channels, etc., the present invention is capable of providing additional $2^{nd}$ order biquad channels simply by increasing the number of clock cycles between each frame sync, i.e., by increasing the clock rate.

Table II illustrates the stored order of the state variables in the state variable RAM 1526 in the disclosed embodiment.

TABLE II

| RAM ADDRESS | STATE VARIABLE | CHANNEL | BIQUAD # |
|---|---|---|---|
| 0 | W(n-1) | 1 | 1 |
| 1 | W(n-2) | | |
| 2 | W(n-1) | | 2 |
| 3 | W(n-2) | | |
| 4 | W(n-1) | | 3 |
| 5 | W(n-2) | | |
| 6 | W(n-1) | | 4 |
| 7 | W(n-2) | | |
| 8 | W(n-1) | 2 | 1 |
| 9 | W(n-2) | | |
| 10 | W(n-1) | | 2 |
| 2N-1 | W(n-1) | N | 4 |
| 2N | W(n-2) | | | where N refers to the number of channels in either a decimating or interpolating direction, e.g., 6 in the disclosed embodiment of an audio codec. Whereas 6 channels requiring 8 state variables each (i.e., 48 total) is described with respect to the state variable RAM 1526, it is to be understood that the principles of the present invention relate to any size IIR filters, and/or any size state variable RAM.

FIG. 18A(1), shows one embodiment of a master address generator 1800a in accordance with the principles of the present invention. In FIG. 18A(1), a delta counter 1802 establishes one input to an appropriate adder 1804, e.g., a seven bit adder. The other input to the adder 1804 is the output of the adder 1804 latched during the previous clock cycle in an output latch 1806. Because there may be some excess clock cycles 1412 in the IIR filter as shown in FIG. 14A, the output of the output latch 1806 (FIGS. 18A(1) and 18A(2)) may be zeroed or preset during the excess clock cycles 1412, depending upon specific applications.

FIG. 18A(2) shows another embodiment of a master address generator 1800b in accordance with the principles of the present invention. In FIG. 18A(2), an alias out-of-range RAM address circuit 1808 is added to the embodiment shown in FIG. 18A(1). The alias out-of-range RAM address circuit 1808 replaces invalid addresses to the state variable RAM 1526 with valid addresses. Invalid addresses are those which would access locations in the state variable RAM 1526 which may be beyond those which contain valid state variables, e.g., addresses other than 0–47 in the embodiment shown in FIG. 15.

For instance, the disclosed alias out-of-range RAM addresses circuit 1808 wraps addresses above 47 back around to 0. Thus, accesses to memory locations 0–47 are allowed to present themselves to the state variable RAM 1526, but an attempted access to memory location 48 will result in an actual access to memory location 0 of the state variable RAM 1526, an attempted access to memory location 49 will result in an actual access to memory location 1, and so on.

The delta counter 1802 outputs a repeating increment integer representing the number of memory locations to advance or retreat for the next access to the state variable RAM 1526. To implement the calculations shown in FIG. 14C within four clock cycles as shown, access to the state variable RAM 1526 is not necessary in the first clock pulse P0 of the first $2^{nd}$ order biquad after the frame sync. However, as shown in FIG. 14C, the state variable for the past data frame, for the next $2^{nd}$ order biquad in the current data frame, is required in clock pulse P1 for multiplication by the coefficient $B_1$. From Table II it is seen that the state variable W(n-1) for the second $2^{nd}$ order biquad is stored in the state variable RAM 1526 at address 2. Thus, a preset 2 is output from the output latch 1806 for the first P1 clock pulse after a new frame. For each access after this, the RAM address is merely incremented or decremented as determined by adder 1804 based on a value of the delta counter 1802.

The pattern output from the delta counter 1802 in the disclosed embodiment, after the first clock pulse P0 in a new data frame wherein the RAM address is preset to 2, is a repeating pattern of +1, -2, -1, +4. This pattern corresponds to the advances and decrements necessary in the state variable RAM 1526 for the calculation in each $2_{nd}$ order biquad. Thus, the pattern repeats at least for as many times as there are $2^{nd}$ order biquads to be calculated in each data frame. In the disclosed embodiment of an audio codec, the delta counter 1802 repeats 4 times for each of 6 IIR filter channels, i.e., 24 times. Note that this repeating pattern increments two memory locations for each $2^{nd}$ order biquad (i.e., every four clock pulses), and is independent of the number of $2^{nd}$ order biquads implemented.

Table III shows the sequential RAM addresses ("RAM" in Table III) made to the state variable RAM 1526 based on the master counter ("Count" in Table III), and the output of the delta counter 1802 ("Incmt" in Table III) output from the adder 1804.

TABLE III

| Count | RAM | Incmt | Count | RAM | Incmt | Count | RAM | Incmt |
|---|---|---|---|---|---|---|---|---|
| 0 | 2 | — | 22 | 13 | -2 | 44 | 20 | +4 |
| 1 | 2 | +1 | 23 | 11 | -1 | 45 | 24 | +1 |
| 2 | 3 | -2 | 24 | 10 | +4 | 46 | 25 | -2 |
| 3 | 1 | -1 | 25 | 14 | +1 | 47 | 23 | -1 |
| 4 | 0 | +4 | 26 | 15 | -2 | 48 | 22 | +4 |
| 5 | 4 | +1 | 27 | 13 | -1 | 49 | 26 | +1 |
| 6 | 5 | -2 | 28 | 12 | +4 | 50 | 27 | -2 |
| 7 | 3 | -1 | 29 | 16 | +1 | 51 | 25 | -1 |
| 8 | 2 | +4 | 30 | 17 | -2 | 52 | 24 | +4 |
| 9 | 6 | +1 | 31 | 15 | -1 | 53 | 28 | +1 |
| 10 | 7 | -2 | 32 | 14 | +4 | 54 | 29 | -2 |
| 11 | 5 | -1 | 33 | 18 | +1 | 55 | 27 | -1 |
| 12 | 4 | +4 | 34 | 19 | -2 | 56 | 26 | +4 |
| 13 | 8 | +1 | 35 | 17 | -1 | 57 | 30 | +1 |
| 14 | 9 | -2 | 36 | 16 | +4 | 58 | 31 | -2 |
| 15 | 7 | -1 | 37 | 20 | +1 | 59 | 29 | -1 |
| 16 | 6 | +4 | 38 | 21 | -2 | 60 | 28 | +4 |
| 17 | 10 | +1 | 39 | 19 | -1 | 61 | 32 | +1 |
| 18 | 11 | -2 | 40 | 18 | +4 | 62 | 33 | -2 |
| 19 | 9 | -1 | 41 | 22 | +1 | 63 | 31 | -1 |
| 20 | 8 | +4 | 42 | 23 | -2 | 64 | 30 | +4 |
| 21 | 12 | +1 | 43 | 21 | -1 | 65 | 34 | +1 |
| 66 | 35 | -2 | 88 | 42 | +4 | 110 | 2 | — |
| 67 | 33 | -1 | 89 | 46 | +1 | 111 | 2 | — |
| 68 | 32 | +4 | 90 | 47 | -2 | 112 | 2 | — |
| 69 | 36 | +1 | 91 | 45 | -1 | 113 | 2 | — |
| 70 | 37 | -2 | 92 | 44 | +4 | 114 | 2 | — |
| 71 | 35 | -1 | 93 | 0 (ali) | +1 | 115 | 2 | — |
| 72 | 34 | +4 | 94 | 1 (ali) | -2 | 116 | 2 | — |
| 73 | 38 | +1 | 95 | 47 | -1 | 117 | 2 | — |
| 74 | 39 | -2 | 96 | 46 | +4 | 118 | 2 | — |

TABLE III-continued

| Count | RAM | Incmt | Count | RAM | Incmt | Count | RAM | Incmt |
|---|---|---|---|---|---|---|---|---|
| 75 | 37 | −1 | 97 | 2 (ali) | +1 | 119 | 2 | — |
| 76 | 36 | +4 | 98 | 3 (ali) | — | 120 | 2 | — |
| 77 | 40 | +1 | 99 | 2 | — | 121 | 2 | — |
| 78 | 41 | −2 | 100 | 2 | — | 122 | 2 | — |
| 79 | 39 | −1 | 101 | 2 | — | 123 | 2 | — |
| 80 | 38 | +4 | 102 | 2 | — | 124 | 2 | — |
| 81 | 42 | +1 | 103 | 2 | — | 125 | 2 | — |
| 82 | 43 | −2 | 104 | 2 | — | 126 | 2 | — |
| 83 | 41 | −1 | 105 | 2 | — | 127 | 2 | — |
| 84 | 40 | +4 | 106 | 2 | — | 0 | 2 | +1 |
| 85 | 44 | +1 | 107 | 2 | — | 1 | 2 | −2 |
| 86 | 45 | −2 | 108 | 2 | — | 2 | 3 | −1 |
| 87 | 43 | −1 | 109 | 2 | — | 3 | 1 | +4 |

*NOTE:
At counts 0 and 98–127, the RAM address bus is preset to 2.

Note that in Table III the RAM addresses walk through the required state variables W(n−1) and W(n−2) for each of the $2^{nd}$ order biquads shown in Table II, when (or before) required for calculation in the circuit of FIG. 15 as shown in FIG. 14C. For example, the first clock pulse P0 of the first $2^{nd}$ order biquad after the frame sync signals corresponds to master count=0. Table III shows that the resulting RAM address is preset to 2, which overrides the output from the adder 1804. The RAM address is not incremented at master count 1, and thus the memory location accessed in the RAM for the clock pulse P1 in the first $2^{nd}$ order biquad (i.e., master count=1) continues to be 2, which addresses the state variable W(n−1) for the next (i.e., second) biquad, i.e., W(n−1)$^{z+1}$ as shown in FIG. 14C. This allows multiplication by $B_1$ in multiplier 1538 shown in FIG. 15, of the first $2^{nd}$ order biquad as shown in FIG. 14C.

For master count=2, i.e., clock pulse P2 of the first $2^{nd}$ order biquad, the RAM address increments by +1 to become 3. Memory location 3 in the state variable RAM 1526 corresponds to a prefetch of W(n−2) for the next $2^{nd}$ order biquad, denoted W(n−2)$^{z+1}$ in FIG. 14C, which is used during clock pulse P3 in the multiplication operation.

For master count=3, i.e., clock pulse P3 of the first $2^{nd}$ order biquad, the RAM address decrements by 2 to become 1. Memory location 1 in the state variable RAM 1526 corresponds to an access to W(n−2) for the current $2^{nd}$ order biquad, which allows updating as shown in FIG. 14C.

For master count=4, clock pulse P0 of the next, i.e., second $2^{nd}$ order biquad, the RAM address decrements by 1 to become 0, corresponding to an access to the state variable W(n−1) for the last, i.e., first $2^{nd}$ order biquad. This access is shown in FIG. 14C as the update of the state variable W(n−1) for the last $2^{nd}$ order biquad with the result W(n) of that last $2^{nd}$ order biquad.

For master count=5, clock pulse P1 of the second $2^{nd}$ order biquad increments by 4 to become 4, which accesses the state variable W(n−1) for the third $2^{nd}$ order biquad. This access is shown in FIG. 14C for the purpose of multiplying $B_1$ by the state variable W(n−1) for the subsequent biquad.

For master count=6, clock pulse P2 of the second order $2_{nd}$ order biquad is incremented by 1 to become 5, which accesses W(n−2) of the subsequent $2^{nd}$ order biquad for use in the multiplier in clock pulse P3 (see FIG. 14C).

For master count=7, clock pulse P3 of the second order $2_{nd}$ order biquad is decremented by 2 to become 3, which accesses the state variable W(n−2) for the current $2^{nd}$ order biquad of the current data frame, for update with the variable W(n−1), since the state variable W(n−2) is no longer needed at that point.

This process continues on through the calculation of all $2_{nd}$ order biquads, for all IIR filter channels. Note in Table III the effect of the aliasing at master count=93, 94, 97 and 98 due to the alias out-of-range RAM address circuit 1808 shown in FIG. 18A(2). If not aliased, the output RAM addressed would be 48, 49, 50 and 51, respectively.

Alias out-of-range RAM address circuit 1808 provides protection to the state variable RAM 1526 against accesses to memory locations which may not exist or should not be accessed.

Note also in Table III that the RAM address takes on the preset value (e.g., 2) during the excess clock cycles, i.e., master counts over 97. The particular value of the RAM address is preset during these clock cycles only for predictability of the response of the IIR filter during the "off" time, but need not be preset at all. To work during the "off" time of the IIR filters, the clock pulses P0–P3 should be prevented after master clock=98.

The two least significant bits of the Master count are decoded to provide write control signals to the state variable RAM 1526 during clock pulses P0 and P3, and to provide read control signals to the state variable RAM 1526 during clock pulses P1 and P2. All state variables stored in state variable RAM 1526 will be read and written to during each data frame.

FIGS. 18B(1) and 18B(2) are schematic diagrams of the embodiments of a master address generator 1800 shown in FIGS. 18A(1) and 18A(2), respectively. These schematics are exemplary circuits only, with the understanding that the principles of the present invention may be carried out in any number of alternative circuits, including by the use of a processor, programmable gate array (PGA), or other logic devices synchronized to the frame sync.

In FIG. 18B(1), the delta counter 1802 comprises a multiplexer (MUX) 1838 which outputs a repeating seven bit pattern corresponding to +1, −2, −1, +4 to the 7 bit adder 1804. The MUX 1838 is controlled by the two least significant bits of the master counter MCOUNT0 and MCOUNT1, which are synchronized with the clock signal, e.g., a 24.576 MHz signal CK24 MHZ, which forms the basis for the counts of a master clock. The control may be halted for master clock counts corresponding to accesses to state variable RAM 1526 beyond those memory locations containing valid data, i.e., based on a NOCOUNT signal which indicates a master count greater than, e.g., 97 in the disclosed embodiment. The RESCNT signal corresponds to a reset of the IIR filter.

The NOCOUNT signal is also used in a circuit to zero the master count for unused clock cycles 1810, which is comprised of a latch clocked at the rate of the clock signal, e.g., CK24 MHZ.

The output latch is represented by latches 1840, 1842 and 1844. Latch 1842 is preset with a 2 when the output latch is reset, to provide the preset RAM address of 2 during the first clock pulse P0 after the frame sync. Latch 1840, while shown as a single bit latch, represents parallel latches for, e.g., bits 2 to 5 of the output RAM address.

FIG. 18B(2) is similar to the schematic of FIG. 18B(1), but additionally includes an alias out-of-range RAM address circuit 1808 as shown in FIG. 18A(2). If the number of state variables stored in the state variable RAM 1526 were to be equal to $2^N$, e.g., 32, 64, 128, etc., then an alias out-of-range circuit 1808 might not be necessary. However, the disclosed embodiment includes 48 state variables in memory locations 0–47 of the state variable RAM 1526. Thus, only six address lines are presented to the state variable RAM 1526 from the adder 1804, and any memory accesses between 48 and 63 are replaced with 0 to 15, respectively by the AND gates 1850, 1852, NAND gate 1851, and latches 1854, 1856 of the alias circuit 1808.

Using a master address generator 1800 and state variable RAM 1526 as shown and described, e.g., with reference to FIGS. 15 and 18, the amount of circuitry necessary remains essentially constant regardless of the number or order of IIR filters implemented. Thus, e.g., as the AC '97 specification evolves to include more channels and/or require additional filtering, the changes required to the IIR filters in accordance with the principles of the present invention is minimized.

A technique to test an integrated circuit having a plurality of digital functional modules will now be described with reference to FIGS. 19 to 22. The present invention allows a user or test technician to insert any of $2^N$ test patterns at internal test nodes of an integrated circuit, overwriting the existing value of the data passing through the test nodes.

Figure 19:
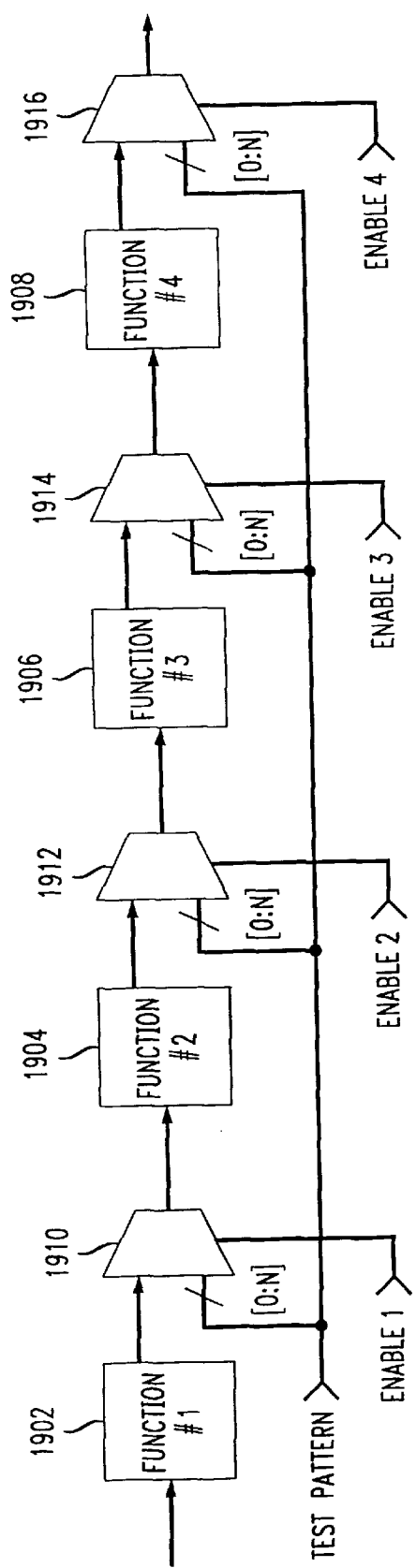
FIG. 19 shows a circuit for inserting test bit patterns between digital functional modules in an integrated circuit.

FIG. 19 shows a circuit for inserting test bit patterns between digital functional modules 1904, 1906 and 1908 in an integrated circuit, e.g., between functional modules of an audio codec as in the described embodiment. While the apparatus and method relating to the inventive test method are described with respect to a particular application, i.e., with respect to an audio codec, this aspect of the present invention has applications outside of audio codecs, e.g., relating to the testing of integrated circuits in general.

The technique shown in FIG. 19 is particularly applicable to integrated circuits wherein the signals available outside of the integrated circuit are limited for practical purposes. While technologies exist to route many signals within an integrated circuit to external pins, the cost of manufacture typically increases as the number of external pins increases. Moreover, it may be desirable to prevent access to some internal signals used for testing purposes by users of an integrated circuit device lest the device be subject to improper use. Nevertheless, no matter how many pins are made available external to the integrated circuit, there typically remain many, many more signals within an integrated circuit that are not made available outside of the integrated circuit but which would allow more efficient and reliable testing of the integrated circuit.

Any one of multiplexers (MUXs) 1910–1916 may be implemented between functional modules 1902–1908 of an integrated circuit device to allow the isolation of a problem to a functional block level. Not all functional blocks in an integrated circuit need have a test node and/or multiplexer associated therewith. Each of the MUXs 1910–1916 are controlled by a respective enable signal Enable1–Enable4. The enable signals Enable1–Enable4 may be separately accessed from outside the integrated circuit, may be encoded into a fewer number of bits for reducing the required number of pins, e.g., two bits to control four enable signals, and/or may be provided from a register which is written to using a conventional address and data bus to the integrated circuit.

In a first logic state of the respective enable signal Enable1–Enable4, each of the MUXs 1910–1916 pass through the normal from the previous functional module to the subsequent functional module. In a second logic state of the respective enable signal Enable1–Enable4, any one or all of the MUXs 1910–1916 pass a test pattern presented to a second input through the MUXs 1910–1916 to the subsequent functional module. Although the same test pattern TEST is passed to the second input of all MUXs 1910–1916 shown in FIG. 19, typically only one MUX 1910–1916 is enabled at a time. With a common test pattern TEST being provided to all MUXs 1910–1916, only one bus to carry the test pattern TEST need be provided. However, a plurality of busses may be provided to simultaneously carry a plurality of test patterns to more than one functional module, should more flexibility in testing techniques be desired.

The test pattern TEST may be sourced from a register on the integrated circuit which the user overwrites as frequently as necessary, e.g., every frame sync signal, thus inserting square wave signals synchronized with an on-circuit function, e.g., a frame signal, in real time if necessary. Alternatively, the bits of the test pattern TEST may be wired to external pins on the integrated circuit.

Moreover, the test pattern TEST may be a predetermined bit pattern selected from a table of predetermined bit patterns, and the table entries can be selected by an encoded bit pattern. For instance, if the test pattern TEST comprises four bits the user or test technician can separately insert up to 16 different pre-determined test patterns at each test node, overwriting the current value of the signals from the previous functional module. The test pattern TEST can either be representative of the actual bit pattern inserted at the designated test node, or it may point to one of a plurality of larger predetermined bit patterns stored in circuitry or memory of the integrated circuit device. For instance, a four-bit test pattern can be written into a register in the integrated circuit device to point to any of, e.g., 16 different memory locations contained on the integrated circuit device. The memory locations may be predetermined, i.e., hardwired into the integrated circuit device, or they may be user programmable memory locations otherwise accessible from the outside world by a conventional address and data bus.

While the test technique shown in FIG. 19 does provide the ability to isolate malfunctioning functional modules within an integrated circuit, the MUXs 1910–1916 may cause delays which would otherwise not be required for normal operation of the integrated circuit device. Unfortunately, this technique may add delay to the signal path even when the test mode is disabled. Nevertheless, the test technique shown in FIG. 19 is suitable and advantageous if the delay added by the MUXs 1910–1916 is tolerable based on the speed of the signals between functional modules.

Figure 20:
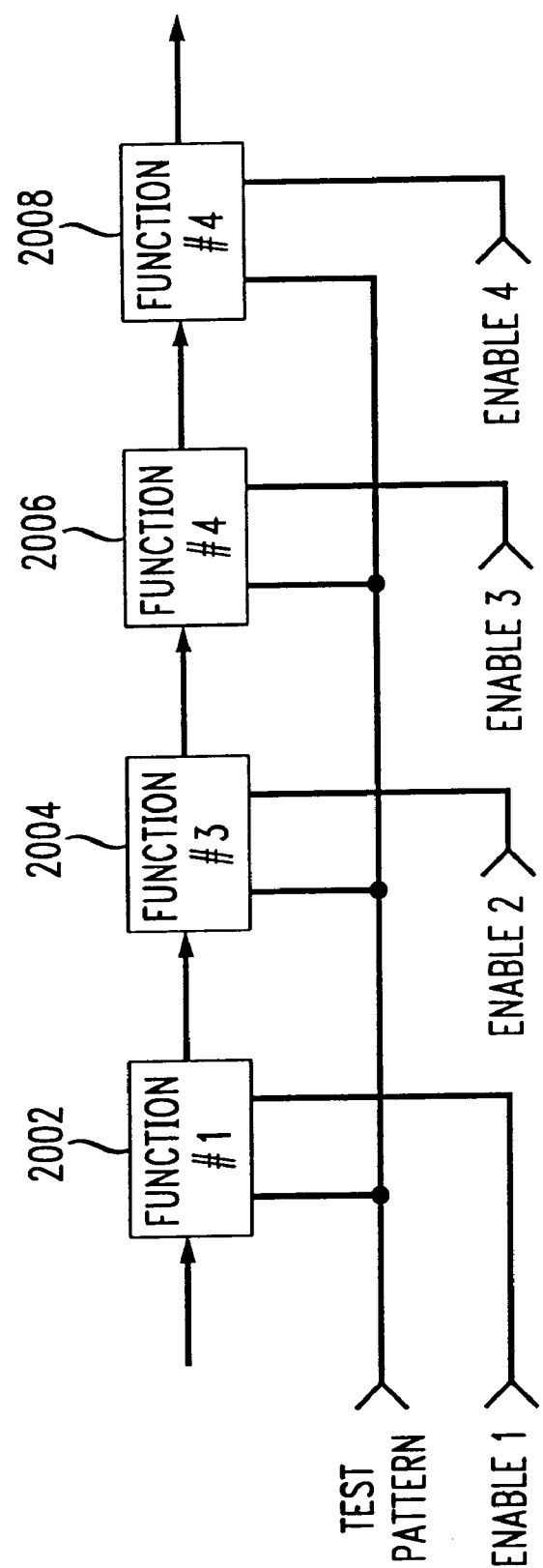
FIG. 20 shows a circuit for inserting test bit patterns into a digital circuit in accordance with another aspect of the present invention.

A more preferred test technique in accordance with the principles of the present invention is shown in FIG. 20. The technique shown in FIG. 20 allows a user or test technician to insert test patterns without adding delay between functional modules either during a test operation mode or during a normal operation mode of the integrated circuit device.

In FIG. 20, the test pattern TEST and individual enable signals Enable1–Enable4 control output components within the functional test modules 2002–2008 to cause them to overwrite the normal operation output.

Figure 21A:
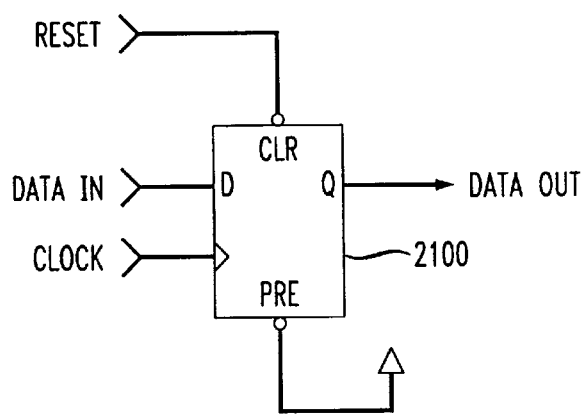
FIGS. 21A and 21B are detailed circuit diagrams showing output latches within functional modules shown in FIG. 20.

In FIG. 21A, a conventionally-controlled flip/flop forms an output latch 2100 for each relevant data bit output from a functional module. The output latch 2100 includes an input line D, a non-inverting output line Q, a clock line on which the output line Q outputs the data present on the input line D, a clear line CLR which outputs a known state, e.g., a logic low or "0" on the output line Q when active (e.g., active low as shown), and a preset line PRE which outputs an alternative known state, e.g., a logic high or "1" on the output line Q when active (e.g., active low as shown). The output latch 2100 presents an undetermined output on output line Q if both the clear line CLR and the preset line PRE are active at the same time. Thus, one or the other of the clear line CLR and the preset line PRE are typically pulled up to an inactive state. In FIG. 21A, the preset line PRE is unused, and thus pulled up to power (e.g., VDD), while the clear line CLR is activated upon a general system reset signal RESET.

Figure 21B:
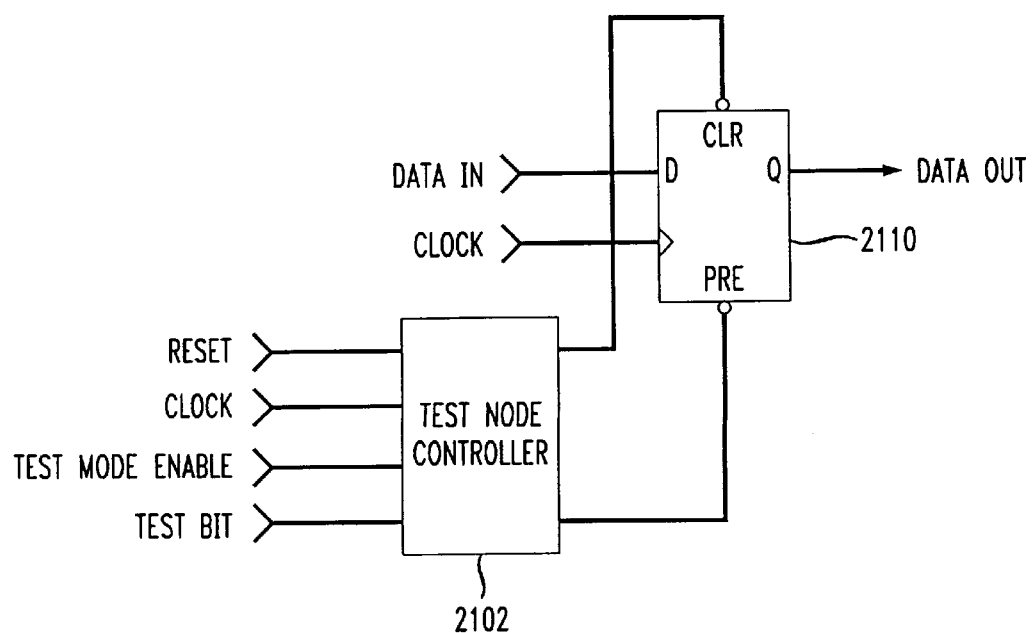

In FIG. 21B, an inventively-controlled output latch 2110 is shown having its clear line CLR and preset line PRE controlled by an inventive test node controller 2102. The circuit in FIG. 21B takes advantage of the realization that digital functional modules typically provide latched output. FIG. 21B shows a flip/flop (F/F) or latch of one output line in any of the functional modules 2002–2008. In accordance with the test technique shown in FIGS. 20 and 21B, the test pattern TEST is inserted between functional modules of an integrated circuit by using, e.g., the preset or clear control signals of latches corresponding to the output bus of the previous functional modules to drive test signals into a subsequent functional module.

In normal operation, the test node controller 2102 provides conventional signaling to the clear line CLR and the preset line PRE based on the activation of a system reset signal RESET. For example, the test node controller 2102 maintains the preset line PRE in an inactive, high logic state at all times in normal operation, while the clear line CLR is activated only when a system reset signal RESET is active.

However, the test node controller 2102 allows a test signal to be interjected into the data output signal output from the output line Q instead of the data input signal input to the input line D, when a test mode enable signal is active. When the test mode enable signal is active, the logic state of the test bit signal input to the test node controller 2102 instructs the test node controller 2101 to manipulate the clear line CLR or preset line PRE to cause the output line Q to output the same logic state as the test bit. This manipulation is synchronized with the clock signal CLOCK input to the test node controller 2102.

Figures 22A, 22B:
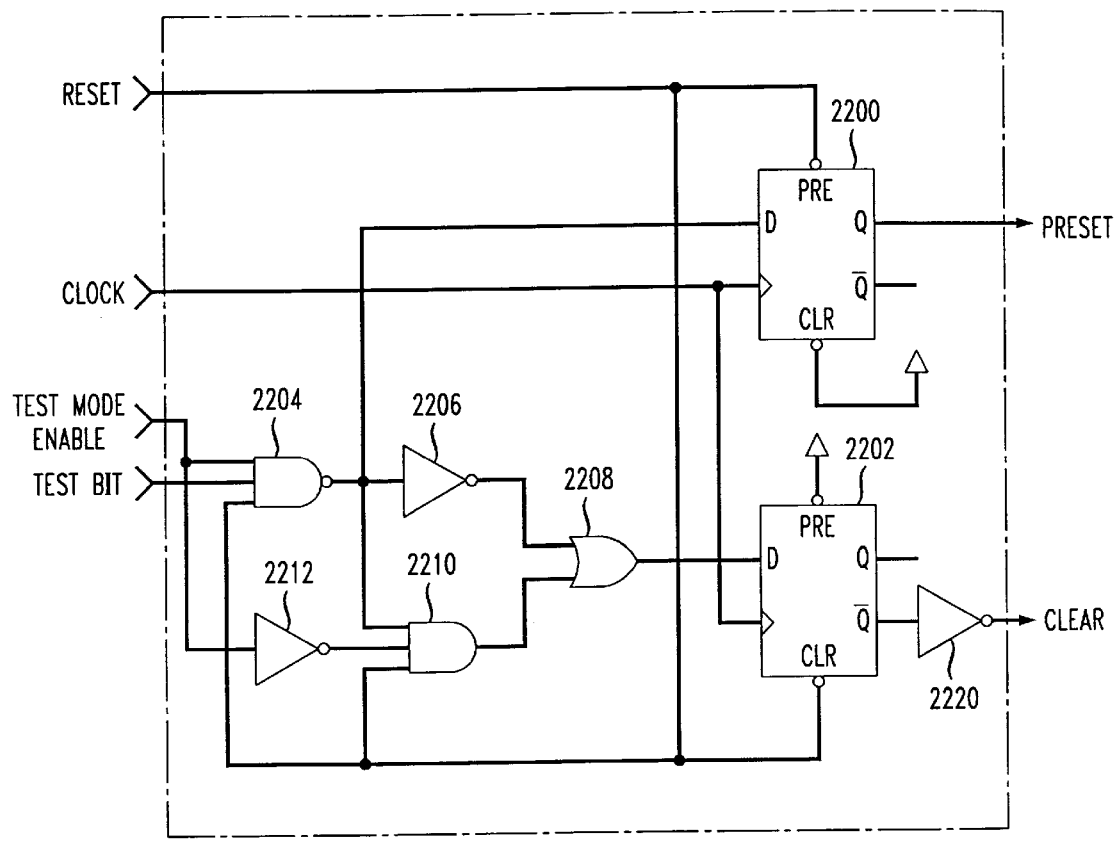
FIG. 22A is a more detailed circuit diagram showing an embodiment of the node controller shown in FIG. 20.
FIG. 22B is a logic table for the input, output and controlled latch output, for the test node controller shown in FIGS. 20–22A.

FIG. 22A is a schematic diagram showing one embodiment of a test node controller 2102 shown in FIG. 21B, and FIG. 22B is a logic table for the input, output and controlled latch output, in accordance with the principles of the present invention.

In particular, FIG. 22A shows one embodiment of a circuit for providing the logic table shown in FIG. 22B. In normal operation, the test node controller 2102 holds the clear line CLR and preset line PRE in an inactive, e.g., high, logic state. This results in the controlled output latch in the relevant functional module being allowed to output on its output line Q the signals present on its input line D based on a clock signal CLOCK applied to that output latch.

In a system reset condition, the test node controller 2102 activates either the clear line CLR or the preset line PRE, e.g. the clear line CLR as shown in FIG. 22B, to cause a known condition to be output from the controlled output latch.

When in a test mode, a test mode enable signal is activated, e.g., in a logic high state, and causes the logic state present on the test bit to be set on the output line Q of the controlled output latch, as shown in the last two rows of the table in FIG. 22B.

While the latches 2200 and 2202 may not be necessary in some applications, they allow synchronization of the test bit output from the controlled output latch with the clock signal CLOCK. Moreover, inverter 2220 provides a delay between the output of a preset control signal PRESET and clear control signal CLEAR from the test node controller 2102 to prevent simultaneous operation of the clear line CLR and preset line PRE signals, which might cause an undetermined state in the controlled output latch.

Not only does the test technique shown with reference to FIGS. 19 to 22 provide a means to test separate functions of a complicated device to ensure proper manufacture and suitable reliability, but it also provides a designer of integrated circuits with a means to test actual manufactured devices more fully before high scale production begins.

While the invention has been described with reference to embodiments using particular circuitry and/or particular logic levels, it is to be understood by those of skill in the art that the particular circuitry may be altered, implemented in software residing in a processor such as a microprocessor, microcontroller or digital signal processor, and/or the logic levels changed, to achieve the same results within the scope of the present invention.

While the invention has been described with reference to the exemplary embodiments thereof, those skilled in the art will be able to make various modifications to the described embodiments of the invention without departing from the true spirit and scope of the invention.

What is claimed is:

1. A digital filter comprising:

a multiplier;

an adder;

a first plurality of latches to present latched data samples to said multiplier in each of four multiplier clock cycles;

a second plurality of latches to present latched data samples to said adder in each of four adder clock cycles;

at least one of said four multiplier clock cycles occurring concurrently overlapping with at least one of said four adder clock cycles;

a read-only memory configured for storing coefficients of said digital filter; and a random-access memory configured for storing state variables of data frames, wherein said multiplier and said adder calculate an output for said digital filter based on a transfer function of $Y(n)=A_S$ wherein $W(n)$ is a state variable of a current data frame, $W(n-1)$ is a state variable of a previous data frame, and $W(n-2)$ is a state variable for a data frame two frames previous, $A_S$ is a scaling factor, and $A_1$ is a constant whereby $W(n)$, $W(n-1)$, and $W(n-2)$ are supplied to said multiplier and said adder from said random-access memory, and $A_S$ and $A_1$ are supplied to said multiplier and said adder from said read-only memory.

2. The digital filter according to claim 1, wherein:

said multiplier and said adder operate substantially simultaneously to calculate said equation for each of a plurality of data channels in an average of substantially four clock cycles for each of said plurality of data channels.

3. A digital filter, comprising:

a multiplier;

an adder;

a first plurality of latches to present latched data samples to said multiplier in each of four multiplier clock cycles;

a second plurality of latches to present latched data samples to said adder in each of four adder clock cycles; and at least one of said four multiplier clock cycles occurring concurrently overlapping with at least one of said four adder clock cycles, wherein one of said second plurality of latches presenting $B_2W(n-2)$ and another of said second plurality of latches presenting $B_1W(n-1)$ to said adder to calculate a sum for a current data frame substantially simultaneously with one of said first plurality of latches presenting $A_S$ and another of said first plurality of latches presenting Y(n) to said multiplier to calculate a product wherein $B_2$ and $B_1$ are coefficients relating to said current filter channel, $A_S$ is a scaling factor, W(n−1) is a state variable of a previous data frame, and W(n−2) is a state variable for a data frame two frames previous.

4. The digital filter according to claim 3, wherein:

said parameter $A_S$Y(n) relates to a calculation for a filter channel previous to said current filter channel, the scaling factor $A_S$ relating to said filter channel previous to said current filter channel.

5. A method of providing a plurality of digital filter channels in a fixed number of clock cycles, said method comprising:

(a) performing three multiplication calculations relating to a first one of said plurality of digital filter channels, in three multiplication clock cycles, respectively;

(b) performing four addition calculations relating to a first one of said plurality of digital filter channels, in four addition clock cycles, respectively;

(c) multiplying a result of one of said addition calculations by a scaling factor in a fourth multiplication clock cycle to arrive at an output for said first one of said plurality of digital filter channels; and (d) performing at least one of a multiplication calculation and an addition calculation for a second one of said plurality of digital filter channels substantially simultaneously with at least one of said steps (a), (b) and (c).

6. The method of providing a plurality of digital filter outputs for a plurality of digital filter channels in a fixed number of clock cycles, said method comprising:

(a) performing three multiplication calculations relating to a first one of said plurality of digital filter channels, in three multiplication clock cycles, respectively;

(b) retrieving data relating to a second one of said plurality of digital filter channels;

(c) performing four addition calculations relating to a first one of said plurality of digital filter channels, in four addition clock cycles, respectively;

(d) multiplying a result of one of said four addition calculations by a scaling factor in a fourth multiplication clock cycle to arrive at an output for said first one of said plurality of digital filter channels; and (e) substantially simultaneous with said step (c) performing three multiplication calculations relating to said second one of said plurality of digital filter channels, in three multiplication clock cycles, respectively.

7. The method of providing a plurality of digital filter outputs for a plurality, of digital filter channels in a fixed number of clock cycles according to claim 6, said method further comprising:

(f) substantially simultaneous with said step (c), multiplying a result of an addition calculation relating to a third digital filter channel by a second scaling factor to arrive at an output for said third digital filter channel.

8. The method of providing a plurality of digital filter outputs for a plurality of digital filter channels in a fixed number of clock cycles, according to claim 7, wherein:

said third digital filter channel is previous in time to said first digital filter channel.

9. A plurality of digital filter channels operable in a fixed number of clock cycles, said plurality of digital filter channels comprising:

means for performing three multiplication calculations relating to a first one of said plurality of digital filter channels, in three multiplication clock cycles, respectively;

means for retrieving data relating to a second one of said plurality of digital filter channels;

means for performing four addition calculations relating to a first one of said plurality of digital filter channels, in four addition clock cycles, respectively; and means for multiplying a result of one of said four addition calculations by a scaling factor in a fourth multiplication clock cycle to arrive at an output for said first one of said plurality of digital filter channels; and means for performing, simultaneous with said means for performing four addition calculations, three multiplication calculations relating to said second one of said plurality of digital filter channels, in three multiplication clock cycles, respectively.

10. The plurality of digital filter channels operable in a fixed number of clock cycles according to claim 9, further comprising:

means for multiplying, simultaneous with said means for performing four addition calculations, a result of an addition calculation relating to a third digital filter channel by a second scaling factor to arrive at an output for said third digital filter channel.

11. The plurality of digital filter channels operable in a fixed number of clock cycles according to claim 10, wherein:

said third digital filter channel is previous in time to said first digital filter channel.

12. A method of digital filtering, comprising:

calculating an output of a digital filter for a previous frame of data during a first clock pulse of a clock cycle of a current data frame;

updating a previous state variable of said previous frame of data during said first clock pulse of a clock cycle;

adding a product from a previous frame of data and an input data to form a current state variable of said current frame of data during a subsequent clock pulse of said clock cycle;

adding another product from said previous frame and said current state variable to form an unscaled output of said digital filter;

wherein a transfer function of said digital filter is based on an equation $Y(n)=A_S[W(n)+A_1W(n-1)+W(n-2)]$, wherein W is a state variable, $A_S$ is a scaling factor, $A_1$ is a constant, W(n) is a state variable for the current data frame, W(n−1) is a state variable for the previous data frame, and W(n−2) is a state variable for a data frame two frames previous.

13. The method of digital filtering according to claim 12, further comprising:

substantially simultaneously performing a multiplication to generate said product and said another product and said step of adding to calculate said equation for each of a plurality of data channels in an average of substantially four clock pulses of said clock cycle for each of said plurality of data channels.

* * * * *